US008277955B2

(12) United States Patent
Fujita

(10) Patent No.: US 8,277,955 B2
(45) Date of Patent: Oct. 2, 2012

(54) COMPOUND FOR ORGANIC EL DEVICE AND ORGANIC EL DEVICE

(75) Inventor: Tetsuji Fujita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 1096 days.

(21) Appl. No.: 11/860,246

(22) Filed: Sep. 24, 2007

(65) Prior Publication Data

US 2008/0090102 A1 Apr. 17, 2008

(30) Foreign Application Priority Data

| Oct. 17, 2006 | (JP) | 2006-282598 |
| Oct. 17, 2006 | (JP) | 2006-282599 |
| Nov. 14, 2006 | (JP) | 2006-307630 |
| Jun. 4, 2007 | (JP) | 2007-148371 |

(51) Int. Cl.
H01L 51/54 (2006.01)
C09K 11/06 (2006.01)

(52) U.S. Cl. ........ 428/690; 428/917; 313/504; 313/506; 252/301.16; 257/40; 257/E51.032; 257/E51.049; 528/394; 528/397

(58) Field of Classification Search ........... 257/E51.037, 257/E51.049, E51.032
See application file for complete search history.

(56) References Cited

U.S. PATENT DOCUMENTS

| 5,281,489 | A | 1/1994 | Mori et al. |
| 6,268,072 | B1 | 7/2001 | Zheng et al. |
| 6,309,763 | B1 * | 10/2001 | Woo et al. ........... 428/690 |
| 6,617,051 | B1 | 9/2003 | Higashi et al. |
| 6,815,090 | B1 * | 11/2004 | Tagami et al. ........ 428/690 |
| 6,899,963 | B1 | 5/2005 | Zheng et al. |
| 7,097,917 | B1 | 8/2006 | Fujita et al. |
| 7,282,275 | B2 | 10/2007 | Wolk et al. |
| 7,727,641 | B2 | 6/2010 | Fujita |
| 7,727,642 | B2 | 6/2010 | Fujita |
| 2003/0091862 | A1 * | 5/2003 | Tokito et al. ........ 428/690 |
| 2004/0048100 | A1 | 3/2004 | Ebisawa et al. |
| 2004/0135131 | A1 | 7/2004 | Treacher et al. |
| 2005/0129979 | A1 | 6/2005 | Kambe et al. |
| 2005/0186443 | A1 | 8/2005 | Marrocco, III et al. |
| 2005/0249972 | A1 | 11/2005 | Hatwar et al. |
| 2006/0040136 | A1 | 2/2006 | Liu et al. |
| 2006/0058494 | A1 | 3/2006 | Busing et al. |
| 2006/0149022 | A1 | 7/2006 | Parham et al. |
| 2006/0199943 | A1 | 9/2006 | Falcou et al. |
| 2006/0238110 | A1 | 10/2006 | Shirai et al. |
| 2008/0090102 | A1 | 4/2008 | Fujita |

FOREIGN PATENT DOCUMENTS

| EP | 1 298 117 A2 | 4/2003 |
| JP | A 63-264692 | 11/1988 |
| JP | A-06-033048 | 2/1994 |
| JP | A-06-073374 | 3/1994 |
| JP | A 2000-026334 | 1/2000 |
| JP | A 2000-026337 | 1/2000 |
| JP | A 2000-268963 | 9/2000 |
| JP | A 2000-268964 | 9/2000 |
| JP | A 2000-323276 | 11/2000 |
| JP | A 2000-344691 | 12/2000 |
| JP | A 2001-196179 | 7/2001 |
| JP | A 2002-008867 | 1/2002 |
| JP | B-3290432 | 3/2002 |
| JP | A 2002-536492 | 10/2002 |
| JP | A-2003-026616 | 1/2003 |

(Continued)

OTHER PUBLICATIONS

Lee et al. "Color tuning in polyfluorenes by copolymerization with low band gap comonomers." Synthetic Metals 1999, vol. 102 pp. 1087-1088.*

(Continued)

*Primary Examiner* — Jennifer Chriss
*Assistant Examiner* — Michael H Wilson
(74) *Attorney, Agent, or Firm* — Oliff & Berridge, PLC

(57) ABSTRACT

A compound for an organic EL device as a light-emitting material for use in an organic EL device is provided. The compound includes a polymer molecule containing a light-emitting molecule for determining a luminescent color region of the light-emitting material, and molecules represented by Formulas (1) to (4) as constituent units.

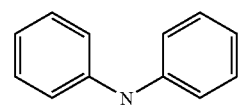

Formula (1)

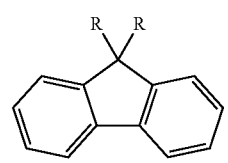

Formula (2)

(wherein R represents an alkyl group, an aryl group, or an alkylaryl group)

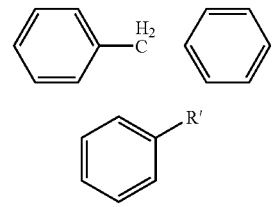

Formula (3)

Formula (4)

(wherein R' represents hydrogen, an alkyl group, or an alkylaryl group).

12 Claims, 18 Drawing Sheets

FOREIGN PATENT DOCUMENTS

| | | |
|---|---|---|
| JP | A 2003-040845 | 2/2003 |
| JP | A 2003-104916 | 4/2003 |
| JP | A 2004-002351 | 1/2004 |
| JP | A-2004-303483 | 10/2004 |
| JP | A-2005-053806 | 3/2005 |
| JP | A-2005-108720 | 4/2005 |
| JP | A 2005-166680 | 6/2005 |
| JP | A 2005-216683 | 8/2005 |
| JP | A 2005-281210 | 10/2005 |
| JP | A-2005-285466 | 10/2005 |
| JP | A-2006-213725 | 8/2006 |
| JP | B-04-211799 | 11/2008 |
| JP | B-04-281754 | 3/2009 |
| WO | WO 98/30071 | 7/1998 |
| WO | WO 02/077060 A1 | 10/2002 |
| WO | WO 2005/059951 A2 * | 6/2005 |

OTHER PUBLICATIONS

Li T. et al., "Synthesis and Electroluminescence Properties of Fluorene Containing Arylamine Oligomer," 2004. Polym. Adv. Technol., vol. 15, pp. 266-269.

Edelmann M. et al., "Dramatically Enhanced Fluorescence of Heteroaromatic Chromophores Upon Insertion as Spacers into Oligo (Triacetylene)s," 2002. Helvetical Chimica Acta, vol. 85, pp. 2195-2213.

Obrey S. et al., "Aluminum Alkoxides as Synthons for Methylalumoxane (MAO): Product-Catalyzed Thermal Decomposition of [Me$_2$Al(µ-OCPh$_3$)$_2$]," 2001, Organometallics, vol. 20, pp. 5162-5170.

Saroja G. et al., "Synthesis of Alkylated Aminofluorenes by Palladium-Catalyzed Substitution at Halofluorenes," 2004. J. Org. Chem., vol. 69, pp. 987-990.

Debad J. et al., "Anodic Coupling of Diphenyibenzo [k] fluoranthene: Mechanistic and Kinetic Studies Utilizing Cyclic Voltammetry and Electrogenerated Chemiluminescence," 1997, J. Org. Chem., vol. 62, pp. 530-537.

Mondal S. et al., "Polycyclic Aromatic Compounds: Part IX—A New Synthesis of Highly Arylated Fluoranthene Derivatives," 1983, Indian Journal of Chemistry, vol. 22B, pp. 225-229.

Debad J. et al., "Dibenzotetraphenylperiflanthene: Synthesis, Photophysical Properties, and Electrogenerated Chemiluminescence," 1996, J. Am. Chem. Soc., Vo. 118, pp. 2374-2379.

Jaffe H. et al., "Interaction of Perpendicular π-Electron Systems," 1963, Perpendicular β-Electron Systems, vol. 85, pp. 1561-1564.

Hreha, et al., "2,7-Bis(diarylamino)-9,9-dimethylfluorenes as Hole-Transport Materials for Organic Light-Emitting Diodes**," Advanced Functional Materials, 2003, 967-973, vol. 13, No. 12, Wiley-VCH Verlag GmbH & Co, KGaA, Germany.

Mitchell et al., "Straining strained molecules. III. The spectral and mutagenic properties and an alternate synthesis of diaceperylene and dicyclopentail[1,2,3-cd:1',2',3'-lm]perylene," Canadian Journal of Chemistry, 1992, 1015-1021, vol. 70, No. 4, Canada.

Oida, et al., "A New Synthesis of 1,3-Diarylisobenzofurans," Synthesis, 1980, 131-133, No. 2, Georg Thierne Verlag, New York.

Marsitzky, et al., "End-Functionalization of Poly(2,7-fluorene): A Key Step toward Novel Luminescent Rod-Coil Block Copolymers," Macromolecules, 1999, vol. 32, No. 25, 8685-8688, American Chemical Society.

"Vinyl Polymers," 2005, Polymer Science Learning Center, Department of Polymer Science, The University of Southern Mississippi.

Office Action issued in U.S. Appl. No. 12/051,417; mailed Dec. 6, 2010.

Office Action issued in U.S. Appl. No. 12/051,417; mailed Dec. 21, 2011.

Office Action issued in U.S. Appl. No. 12/051,417; mailed Jun. 4, 2012.

* cited by examiner

EXISTENCE OF ISOMERS

EL WAVELENGTH IN EXAMPLE 1
(THE SAME WAVEFORMS AS SHOWN IN EXAMPLES 3 AND 5)

EL WAVELENGTH IN EXAMPLE 2
(THE SAME WAVEFORMS AS SHOWN IN EXAMPLES 4 AND 6)

HOST 1 LIGHT-EMITTING WAVEFORM
(COMPARATIVE EXAMPLE 1)

HOST 2 LIGHT-EMITTING WAVEFORM
(COMPARATIVE EXAMPLE 2)

HOST 3 LIGHT-EMITTING WAVEFORM
(COMPARATIVE EXAMPLE 3)

(INTERMEDIATE)
EXISTENCE OF ISOMERS

EL WAVELENGTH IN EXAMPLE 7
(THE SAME WAVEFORMS AS SHOWN IN EXAMPLES 9 AND 11)
LIGHT-EMITTING SPECTRUM

EL WAVELENGTH IN EXAMPLE 8
(THE SAME WAVEFORMS AS SHOWN IN EXAMPLES 10 AND 12)
LIGHT-EMITTING SPECTRUM

EL WAVELENGTH IN EXAMPLE 13
(THE SAME WAVEFORMS AS SHOWN IN EXAMPLES 15 AND 17)

EL WAVELENGTH IN EXAMPLE 14
(THE SAME WAVEFORMS AS SHOWN IN EXAMPLES 16 AND 18)

COMPOUND FOR ORGANIC EL DEVICE AND ORGANIC EL DEVICE

BACKGROUND

1. Technical Field

The present invention relates to an organic EL device which is used in a display, a display light source, and the like, and more specifically relates to a compound for an organic EL device which is preferably used in a coated organic EL device, and an organic EL device using the same.

2. Related Art

In recent years, development of organic electroluminescent devices (also referred to organic EL devices) which serves as self-emissive type displays replacing liquid crystal displays, has been rapidly advancing. Such an organic EL device and a method of preparing the same have been disclosed in, for example, JP-A-2000-323276, JP-T-2002-536492, JP-A-63-264692, and JP-A-2003-40845.

In the related art, for an organic EL device (also referred to an organic EL device), technologies involving using a host material and a light-emitting dopant for the material configuration for a light-emitting layer in order to accomplish higher luminous efficiency, change an luminescent colors, and longer life time, are known. Such technologies are frequently used particularly for a device in which an organic material in an organic EL device is applied using a deposition method, but they have been rarely used for a polymeric material-coated organic EL device in which a film is formed by using an ink jet method (liquid droplet discharge method) or a spin coating method.

As used herein, the phrase "the host material and the light-emitting dopant" are defined/characterized as follows:

(1) The host material refers to a material capable of transporting both holes and electrons.

(2) For an organic EL device in which a light-emitting dopant is not used in a light-emitting layer, light emission from a host material is observed. On the other hand, for an organic EL device in which both a light-emitting dopant and a host material are used, light emission from the host material is substantially not observed, but light emission from the light-emitting dopant is observed in most cases.

(3) The EL light-emitting spectrum observed in an organic EL device in which both a host material and a light-emitting dopant are used is that of fluorescent light or phosphorescent light of a light-emitting center in the light-emitting dopant. As used herein, the phrase "light-emitting center" refers to a part of a light-emitting dopant. It means an organic molecule backbone capable of emitting a strong fluorescent light/phosphorescent light, and also means a partial backbone by which the waveform of light is substantially determined.

For the polymeric material-coated organic EL device, the reasons why technologies involving using both a host material and a light-emitting dopant have been rarely used are presumably as follows.

(1) When a mixed solution of a host and a light-emitting dopant is coated, a phenomenon in which the light-emitting dopant bleeds out is observed. This is generally due to the fact that there exists a phenomenon that when a mixed solution of a low molecular weight material in a polymer is coated and dried, the low molecular weight material is exuded to an outer layer, or it becomes segregated from a coated film during drying.

(2) The light-emitting dopant material has little capability of trapping holes/electrons. This is prominent in the case where the host is a conjugated polymer. In the case where the host is a conjugated polymer, holes and electrons preferentially flow within the host polymer molecule. Thus, it is expected that it is difficult for a light-emitting dopant to trap holes and electrons.

(3) Development of a light-emitting dopant material has proceeded slowly. It is believed that due to the aforementioned two reasons, in the field of polymer-coated organic EL devices, a system composed of a host plus a light-emitting dopant has a lower effect than a deposition-based EL (low molecular weight EL), and thus development of such materials has proceeded slowly.

An advantage of some aspects of the invention is that it provides a compound for an organic EL device, which functions as a light-emitting dopant in a light-emitting layer, as a material for forming light-emitting layer, particularly capable of exhibiting higher luminous efficiency and longer life time, and an organic EL device using the same. Specifically, the compound for an organic EL device and the organic EL device according to some aspects of the invention are provided for an organic EL device which emits light in a luminescent color region determined by a light-emitting molecule, and exhibits improved luminous efficiency and luminance half life.

The present inventors have conducted extensive studies in order to solve the above-described problems, and as a result, they have found the following knowledge.

In order to solve the problem as described in (1) the following means can be employed. By increasing the molecular weight of the light-emitting dopant, the light-emitting dopant would not bleed out during applying and drying. It is preferable that the entire dopant preferably includes a conjugated polymer having N atoms, in addition to a general $\pi$ conjugated polymer. However, in a coated organic EL, it is necessary to dissolve the dopant in a suitable solvents, and thus according to the design, its molecular weight may be increased with a non-conjugated linkage to a suitable molecular weight.

Further, in order to solve the problem as described in (2), the following means can be employed. When the molecular weight is increased for the purpose of solving the problem as described in (1), a functional group capable of preferentially trapping holes or electrons is incorporated in the light-emitting dopant molecule to improve the function of the dopant, as a guideline for the molecular design. Particularly, a functional group having a hole trapping function is incorporated in the molecule to improve the function as a dopant.

It is preferable that the light-emitting center in the dopant and the functional group having a hole trapping function are connected to each other through $\pi$-conjugation. This is because the same effect as the case where the light-emitting center directly traps holes can be attained by $\pi$-conjugation.

One of the measures for improving a hole trapping property is an IP value (ionization potential) of a host material, which is required to be equal to or more than the oxidation potential of the host material.

Further, the present inventors have continued extensive studies based on these findings, thereby completing the invention.

That is, the compound for an organic EL device according to an aspect of the invention is a compound for an organic EL device as a light-emitting material for use in an organic EL device, comprising polymer molecules containing light-emitting molecules for determining a luminescent color region of the light-emitting material, and molecules represented by Formulas (1) to (4) as constituent units.

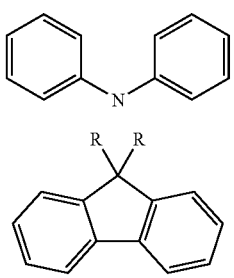

Formula (1)

Formula (2)

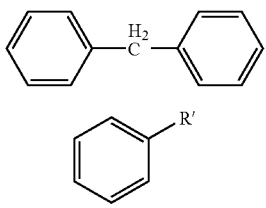

(wherein R represents an alkyl group, an aryl group, or an alkylaryl group)

Formula (3)

Formula (4)

(wherein R represents hydrogen, an alkyl group, or an alkylaryl group)

Further, in the compound for an organic EL device, the light-emitting molecule preferably contains one molecule selected from the molecules represented by Formulas (5) to (7).

Formula (5)

Formula (6)

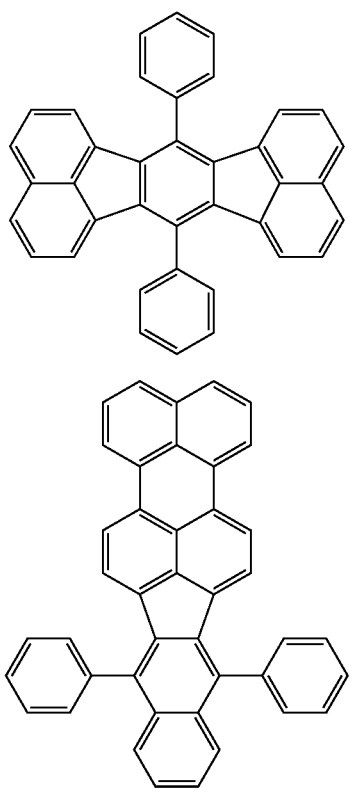

Formula (7)

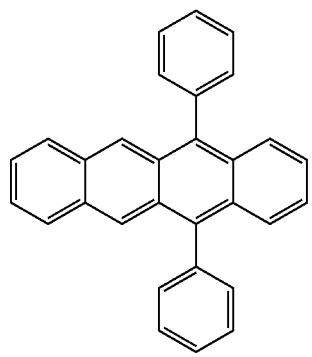

In the polymer molecules, the light-emitting molecule represented by Formula (5) functions as a molecule unit which emits yellow light in an organic EL device. The light-emitting molecule represented by Formula (6) functions as a molecule unit which emits yellow light in an in an organic EL device. Further, the light-emitting molecule represented by Formula (7) functions as a molecule unit which emits green light in an in an organic EL device.

In addition, the molecule represented by Formula (1) functions as a hole trapping unit, and the molecules represented by Formulas (2) and (3) function as a connecting unit for increasing the molecular weight. The molecule represented by Formula (2) functions as an electron trapping unit, and function to control the amount of the electrons flowing in the light-emitting layer even though the amount is small. Further, the molecule represented by Formula (4) is a functional group for avoiding the possibility of the end of the molecule to be a halogen atom.

Since the polymer molecules are capable of trapping holes, they can be used in a light-emitting layer of an organic EL device, to allow the polymer molecules themselves to trap holes flowing in the light-emitting layer. As a result, the polymer molecules generate cations. Then, these cations trap electrons flowing in the light-emitting layer, and thus recombination occurs within the polymer molecules. Thus, the molecule units represented by Formulas (5) to (7) etc. which are the light-emitting units (light-emitting molecules) perform EL light emission.

As used herein, the "recombination" means that a molecule in the light-emitting center is transferred into an excited state, which is derived by the holes and the electrons trapped by the polymer molecule.

That is, energy emitted during a process for transition from an "excited state" to a "ground state is observed as EL light emission.

According to the configuration described above, by using the polymer molecules in an organic EL device, light emission particularly with high efficiency and long life time, that is, light emission in a luminescent color region determined by a light-emitting molecule can be obtained.

Further, in the compound for an organic EL device, the polymer molecules are preferably represented by Formula (8).

Formula (8)

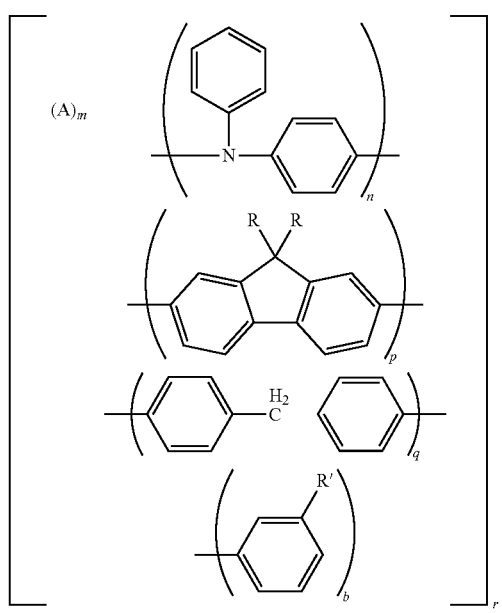

(wherein A represents one selected from the groups represented by Formulas (9) to (11), R represents an alkyl group, an aryl group, or an alkylaryl group, and R" represents hydrogen, an alkyl group, or an alkylaryl croup. Furthers m, n, and p each represent an integer of at least 1, and q and b each represent an integer of at least 0. r represents an integer of at least 1)

Formula (9)

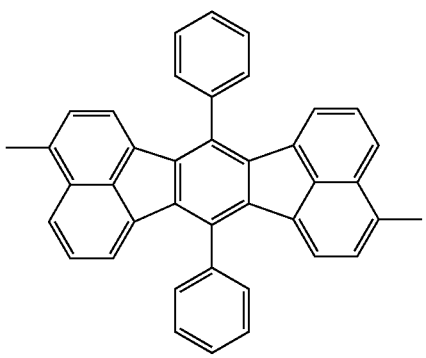

Formula (10)

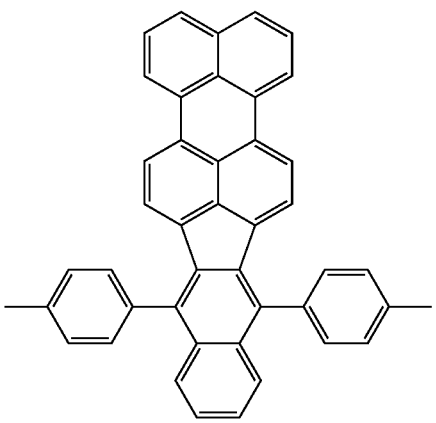

Formula (11)

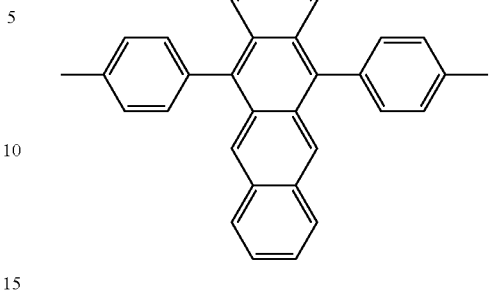

As described above, by using the polymer molecules in an organic EL device, light emission with high efficiency and long life time can be obtained.

In addition, in Formula (8), r represents an integer indicating a polymerization degree of an oligomer unit which constitutes the polymer molecule (which means a minimum unit constituted with the units represented by Formulas (7) to (9), and Formulas (1) to (4).

In Formula (8), q is preferably 0, but q may be an integer of 1 to 4 according to the types of the solvent used for a coating ink, since the solubility may be decreased in the absence of the constituent unit represented by Formula (3) or by r values.

Furthermore, for the oligomer unit represented by Formula (8) in the compound for an organic EL device, an integer m, which refers to the number of the units represented by A, is preferably 1 or 2. If there exist two or more light-emitting centers within the dopant molecule, a problem such as concentration quenching may occur, thereby m being preferably 1.

For the above-configured oligomer, r is 1 in Formula (8).

By such the molecular design of the oligomer, a sufficient EL light-emitting luminance can be obtained.

Further, for the oligomer unit represented by Formula (8) in the compound for an organic EL device, an integer n, which refers to the number of the units represented by Formula (1) as the units having a hole trapping function, is preferably at least 2.

By such the molecular design of the oligomer, a sufficient EL light-emitting luminance can be obtained.

In addition, for the oligomer unit represented by Formula (8) in the compound for an organic EL device, an integer p, which refers to the number of the units represented by Formula (2) as the units having an electron trapping function, as well as functioning as a connecting unit for increasing the molecular weight, is preferably 1 to 4.

By such the molecular design of the oligomer unit, the solubility in a solvent can be improved, and the flow of the electrons can be controlled, thereby promoting the optimization of the luminous efficiency.

Further, in the construction of the oligomer unit represented by Formula (8) in the compound for an organic EL device, it is preferable that the unit represented by A is directly connected to the unit represented by Formula (1) at one or more points. This is because the connection between the unit represented by A and the unit represented by Formula (1) has a significant effect on a fluorescence waveform, that is, an EL waveform.

Specifically, if a group represented by Formula (9) is used as the unit represented by A, it is preferable that the unit represented by Formula (9) is directly connected to the unit represented by Formula (1) at two points. If the unit represented by Formula (9) is directly connected to the unit represented by Formula (1) at one point, a yellow green color is emitted, whereas if the unit represented by Formula (9) is directly connected to the unit represented by Formula (1) at zero point, a blue green color is emitted.

Further, if a group represented by Formula (10) is used as the unit represented by A, it is preferable that the unit represented by Formula (10) is directly connected to the unit represented by Formula (1) at one or more points in order to emit yellow light.

In addition, if a group represented by Formula (11)) is used as the unit represented by A, it is preferable that the unit represented by Formula (11) is directly connected to the unit represented by Formula (1) at one or more points in order to emit green light.

By such the molecular design of the oligomer unit, a hole trapping property can be improved, thereby promoting the improvement of luminous efficiency, and luminance half life.

Further, for the configuration of the oligomer unit represented by Formula (8) in the compound for an organic EL device, it is preferable that an integer b, which refers to the number of the units represented by Formula (4) as a functional group for avoiding the possibility of the end of the molecule to be a halogen atom, is preferably 2.

In addition, the organic EL device according to an aspect of the invention includes the compound for an organic EL device.

By using the compound for an organic EL device, a good organic EL device is obtained.

Further, in the organic EL device, the compound for an organic EL device is preferably used in the light-emitting layer.

By using the compound for an organic EL device in the light-emitting layer, the characteristics of the material can be exhibited. Based on this, it is possible to obtain a device having good characteristics such as luminous efficiency and luminance half life.

Further, in the organic EL device, the compound for an organic EL device is preferably used as a light-emitting dopant material in the light-emitting layer.

As used herein, the light-emitting layer refers to a region (layer) which performs EL light emission while applying a voltage to generate a current. In the case of a coated organic EL, many of the materials constituting the light-emitting layer are typically composed of one kind thereof only. It has three functions, that is, an EL light-emitting function, in addition to electrons and holes injecting/transporting functions.

Further, the light-emitting dopant refers to a dopant which is used in a light-emitting layer, and has a main function to emit lights among the above-mentioned three functions. At this time, an organic material having main functions to inject/transport electrons and holes is used at the same time, and this material is referred to a host material.

By using the compound for an organic EL device as a light-emitting dopant material in the light-emitting layer, the characteristics of the material can be exhibited. Based on this, it is possible to obtain a device having good characteristics such as luminous efficiency and luminance half life.

Further, in the organic EL device, the light-emitting layer is formed of a light-emitting dopant material and a host material, wherein the light-emitting dopant material and the host material in the light-emitting layer are preferably contained at such a ratio that k expressed in % by weight as calculated by Equation 12, is 0.5% by weight or more and 10.0% by weight or less.

$$k=(a/(b+c))\times 100 \qquad \text{Equation 12}$$

(wherein a is the weight of the units containing the light-emitting molecules in the light-emitting dopant material, b is the weight of the light-emitting dopant material used, and c is the weight of the host material used)

Generally, the light-emitting region (the light-emitting molecule, in the case of the light-emitting dopant material) in the light-emitting dopant has a high fluorescence intensity. As a result, it is said that if the light-emitting dopant in the device (element) can trap electrons and holes with high efficiency, it is possible to induce EL light emission even when the k value is around 0.1% by weight. However, if the k value is too small, there are problems such as light emission of the host material due to insufficient energy transfer, or insufficient electron and hole trapping. Accordingly, the lower limit of the range of the k values is preferably set at 0.5% by weight. Further, it is difficult to define the upper limit of the range of the k values, and as long as the light-emitting dopant is intended to exhibit a light-emitting function, the upper limit of the range of the k values may be set at from 20% by weight to 30% by weight. However, if the addition amount is too high, sufficient EL light emission cannot be obtained due to concentration quenching. Therefore, the realizable upper limit of the range of the k values for luminous efficiency is preferably set at 10% by weight.

Further, in the organic EL device, the light-emitting layer is formed of a light-emitting dopant material and a host material, and the host material is a homopolymer or copolymer containing at least one material backbone selected from fluorene, arylamine, and anthracene.

The host material is required to have a performance to transport holes and electrons well. Further, the energy gap between a HOMO (highest occupied molecular orbital) and a LUMO (lowest unoccupied molecular orbital) in a molecule orbital is required to be larger than those of the units (light-emitting molecules) represented by Formulas (5) to (7). The vacuum level of the LUMO (lowest unoccupied molecule orbital) is required to be larger than that of the polymer represented by Formula (8).

By satisfying the above-mentioned requirements, both holes and electrons are favorably injected from the host material to the light-emitting dopant, thereby improving luminous efficiency and life time.

Further, in the organic EL device, at least one layer of a hole injecting layer or a hole transporting layer is preferably provided between the light-emitting layer and the anode.

By such the configuration, holes are more easily injected to the light-emitting layer, thereby promoting the improvement of luminous efficiency.

Further, the HOMO (highest occupied molecular orbital) can be measured by means of a photoelectron spectroscopic device (AC-1) manufactured by Riken Keiki Co., Ltd., etc.

Further, the energy gap between the HOMO (highest occupied molecular orbital) and the LUMO (lowest unoccupied molecular orbital) can be measured by means of a thin film absorption spectrum of the host material used, and thus generally, an absorption band at a largest wavelength of the absorption spectrum is used as an energy gap. Further, the vacuum level of the LUMO can be determined more simply, as compared with the vacuum level of HOMO, and the gap of HOMO-LUMO.

Further, in the organic EL device, the light-emitting layer is preferably prepared by application using a spin coating method or a liquid droplet discharge method.

As such, the compound for an organic EL device is applied using a spin coating method or a liquid droplet discharge method to prepare a light-emitting layer. As a result, it is possible to obtain a device having good characteristics such as luminous efficiency and luminance half life.

Here, since the compound for an organic EL device is an oligomer or a polymer molecule, and it has good compatibility with the polymer of the host material. Accordingly, the host material and the light-emitting dopant material can be uniformly dispersed in the light-emitting layer.

Further, since the compound for an organic EL device has a large molecular weight, a part or all of the compound is decomposed during deposition. As a result, the characteristics of the obtained organic EL device are deteriorated.

BRIEF DESCRIPTION OF THE DRAWINGS

The Invention will be described with reference to the accompanying drawings, wherein like numbers reference like elements.

DESCRIPTION OF EXEMPLARY EMBODIMENTS

Hereinafter, embodiments of the invention will be described in detail.

First, a First Embodiment of the compound for an organic EL device according to an aspect of the invention will be described with reference to Synthetic Examples.

First Embodiment

Compound for Organic EL

In the First Embodiment of the compound for an organic EL device according to an aspect of the invention, the polymer molecule represented by Formula (13) was prepared by a synthesis method on the basis of the following Synthetic Example.

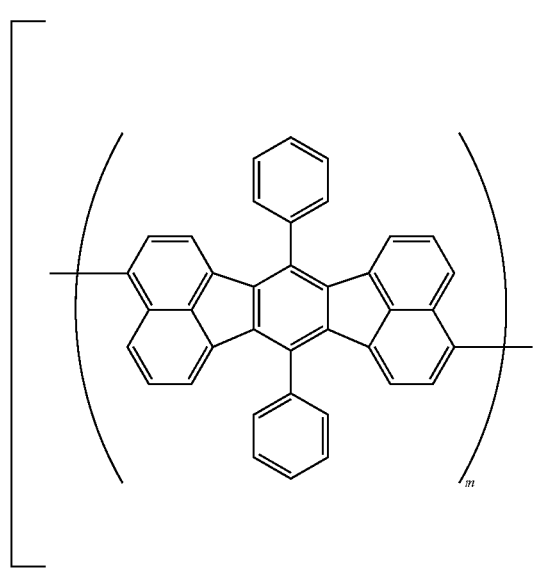 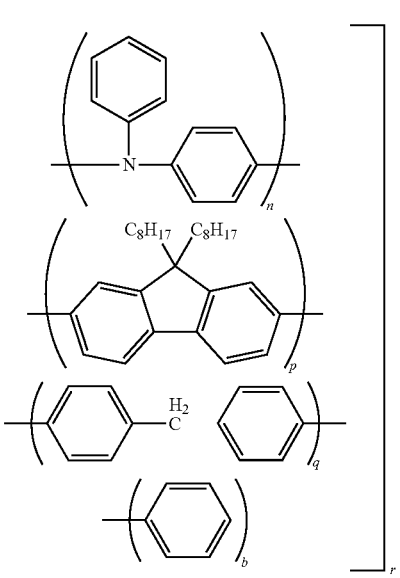

Formula (13)

(wherein the theoretical values for the synthesis reaction are as follows: m=1, n=4, p=4 q=4 b=2, and r=1, and molecular weight MW=2857)

Synthetic Example 1

Figure 1:
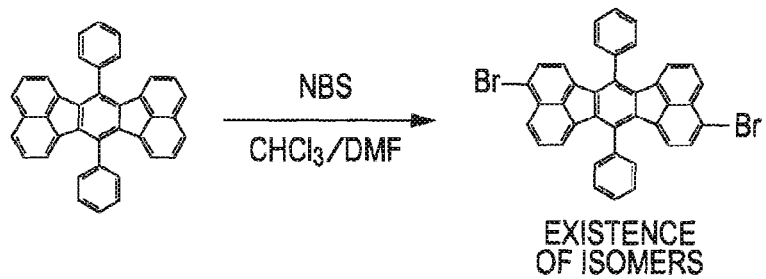
FIG. 1 is a view illustrating the synthesis method of Synthetic Example 1.

3,10-Dibromo-7,14-diphenylacenaphtho[1,2-k]fluoranthene (isomer: 3,11-dibromo-7,14-diphenylacenaphtho[1,2-k]fluoranthene, (intermediate) was synthesized in the following manner by a synthesis method as shown in FIG. 1.

First, under an atmosphere, 5 g of 7,14-diphenylacenaphtho[1,2-k]fluoranthene was introduced to a 300 cm$^3$ Schrenk tube.

Then, 50 m$^3$ of chloroform as a solvent was introduced thereto, and the mixture was heated and dissolved at 60° C. Further, 50 cm$^3$ of dimethylformamide (DMF) as a solvent was introduced thereto. After cooling the mixture at 40° C., 3.9 g of N-bromosuccinimide (NBS) was introduced four doses over 3 hours. After that, the mixture was heated at 50° C. for 1 hour, and thereafter left to stand under stirring at room temperature for 10 hours. After reaction, the mixture was washed and separated with chloroform/water using a separating lot. The impurities were removed by silica gel chromatography and reprecipitation. Silica gel chromatography was carried out using toluene:hexane=1:3 as a developing solvent, and the reprecipitation was carried out using dichloromethane/hexane.

As a result, 3.2 g (yield 48.2%) of a yellow white solid was obtained.

Synthetic Example 2

Figure 2:
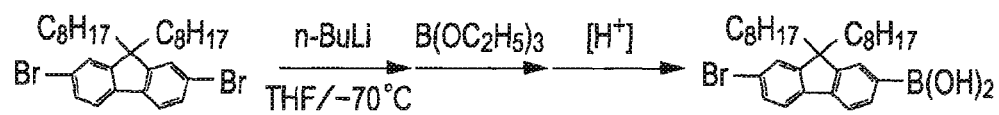
FIG. 2 is a view illustrating the synthesis method of Synthetic Example 2.

2-Bromo-9,9-di-n-octylfluorenyl-7-boric acid was synthesized in the following manner by a synthesis method as shown in FIG. 2.

First, 4 g (7.3×10$^{-3}$ mol) of 2,7-dibromo-9,9-di-n-octylfluorene, and 100 cm$^3$ of THF that had been dried over sodium were added to a 200 cm$^3$ Schrenk tube that had been purged with Ar, thereby obtaining a solution. This solution was cooled to −70° C. 4.9 cm$^3$ of a 1.5 mol/l solution of n-butyllithium in hexane was added to the solution, and left to stand for 1 hour. While cooling was continued, 1.1 g (7.5×1 mol) of triethyl borate was added to the solution to perform a reaction for 1.5 hours. After reaction, 5 cm$^3$ of an aqueous 40% HCl solution was added to the reaction solution at 5° C. One hour later, the reaction solution was neutralized by setting pH to 7 with a saturated, aqueous sodium carbonate solution.

Then, the organic layer (THF layer) was separated using a separating lot. A suitable amount of magnesium sulfate was added to the separated THF solution to remove water. After removing magnesium sulfate using a filter paper, hexane was added to the solution to precipitate a target product. Purification was carried out by a reprecipitation method. THF and hexane were used as the solvents.

Synthetic Example 3

Figure 3:
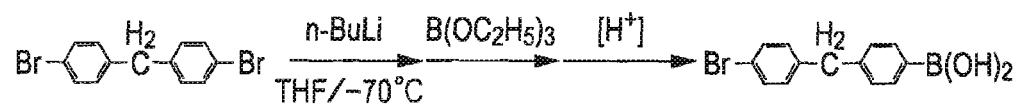
FIG. 3 is a view illustrating the synthesis method of Synthetic Example 3.

1-(4-Bromobenzyl)-4-phenylboric acid was synthesized in the following manner by a synthesis method as shown in FIG. 3.

First, 5 g (1.5×10$^{-2}$ mol) of 4,4'-bisbromophenylmethane, and 50 cm$^3$ of THF that had been dried over sodium were added to a 200 cm$^3$ Schrenk tube that had been purged with Ar, thereby obtaining a solution. This solution was cooled to −70° C. 10.2 cm$^3$ (1.5×10$^{-2}$ mol) of a 1.5 mol/l solution of n-butyllithium in hexane was added to the solution, and left to stand for 1 hour. While cooling was continued, 2.2 g (1.5× 10$^{-2}$ mol) of triethyl borate was added to the solution to perform a reaction for 1.5 hours. After reaction, 5 cm$^3$ of an aqueous 40% HCl solution was added to the reaction solution at 5° C. One hour later, the reaction solution was neutralized by setting pH to 7 with a saturated, aqueous sodium carbonate solution.

Then, the organic layer (THF layer) was separated using a separating lot. A suitable amount of magnesium sulfate was added to the separated THF solution to remove water. Magnesium sulfate was removed using a filter paper, and then the solvent was removed using an evaporator.

As a result, 4 g of a transparent thick product was obtained, which would be used for a subsequent reaction.

Synthetic Example 4

Figure 4:
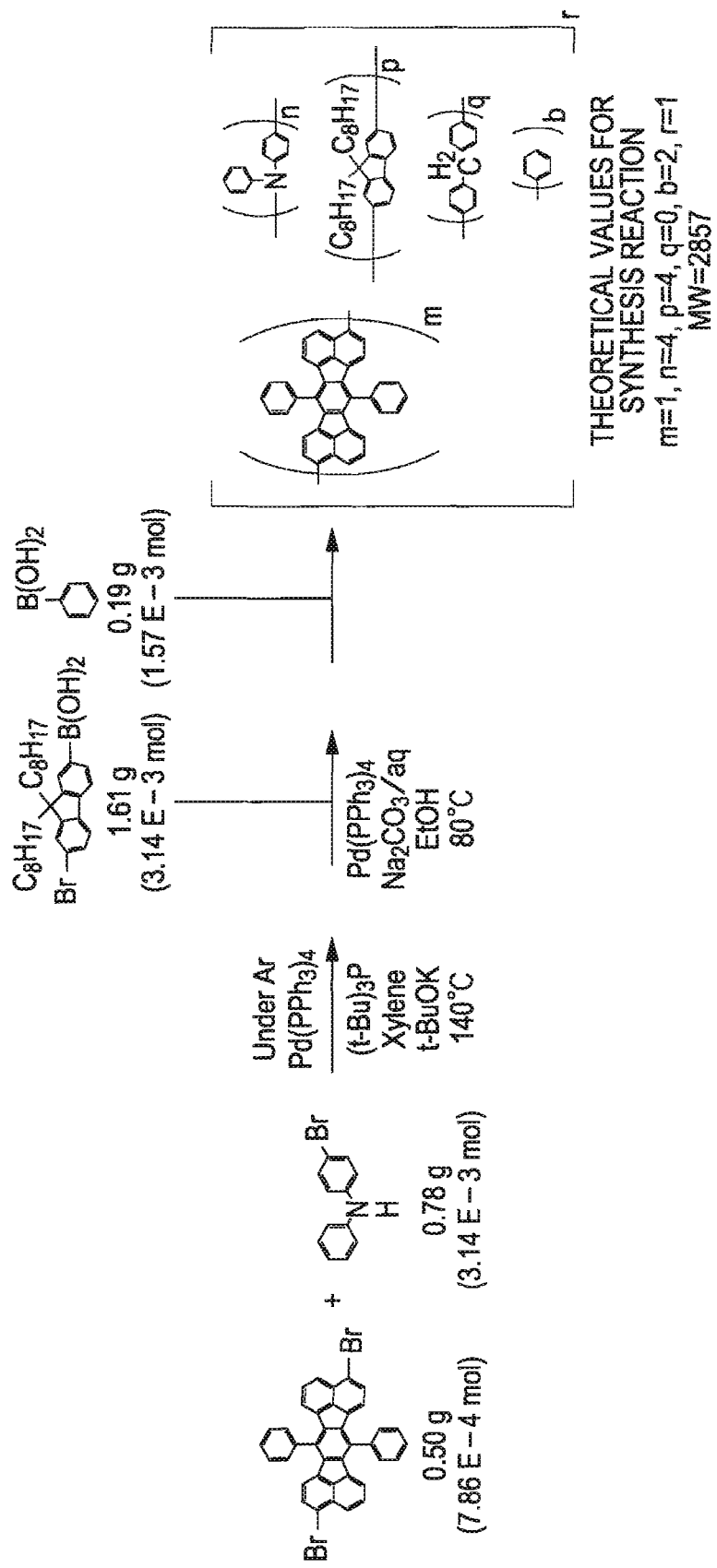
FIG. 4 is a view illustrating the synthesis method of Synthetic Example 4.

An EL material (EL material 1), that is, the compound for an organic EL device according to the First Embodiment of the invention was synthesized by the synthesis route as shown In FIG. 4.

First, 0.5 g ($7.86 \times 10^{-4}$ mol) of diphenylacenaphtho[1,2-k]fluoranthene derivative which had been previously synthesized (in Synthetic Example 1), and 0.78 g ($3.14 \times 10^{-3}$ mol) of 4-bromodiphenylamine were added to a 300 cm$^3$ Schrenk tube that had been purged with Ar, and then 100 cm$^3$ of dry xylene was added thereto. The resulting solution was heated to 130° C.

Then, 0.1 g of a tetrakistriphenylphosphine palladium complex (Pd(PPh$_3$)$_4$), 0.3 g of t-butoxypotassium, and 0.1 g of tris-t-butylphosphine were added to the solution to perform a reaction in an oil bath at 140° C. for 5 hours. Five hours later,

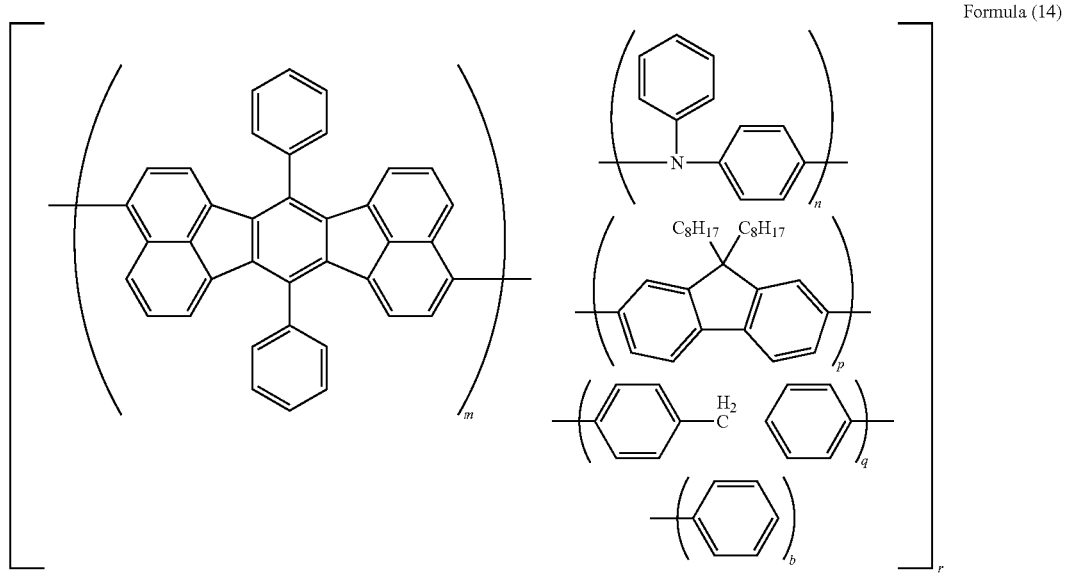

Formula (14)

the solution was cooled to a temperature of 80° C., and 25 cm$^3$ of ethanol, and 50 cm$^3$ of a saturated, aqueous sodium carbonate solution were added to the solution. Thereafter, the solution was stirred for 15 minutes.

Thereafter, 1.6 g ($3.14 \times 10^{-3}$ mol) of 2-bromo-9,9-di-n-octylfluorenyl-7-boric acid (Synthetic Example 2), and 0.1 g of a tetrakistriphenylphosphine palladium complex (Pd(PPh$_3$)$_4$) were added to the solution to perform a reaction for an additional 4 hours. Four hours later, 0.19 g ($1.57 \times 10^{-3}$ mol) of a commercially available phenylboric acid was further added to the solution to perform a reaction for 4 hours. During the reaction, a trace amount of Ar was continuously supplied to the solution to prevent the incorporation of oxygen and water.

After reaction, air was blown into the reaction solution via bubbling while heating the solution for 30 minutes. Then, the reaction solution was cooled to room temperature, and then transferred to a 1 liter separating lot, and sufficiently washed with distilled water while being extracted with toluene. The toluene layer in the separating lot was sufficiently dried over magnesium sulfate, and then purified by silica gel chromatography and reprecipitation. As the developing solvent for silica gel chromatography, xylene was used. The solvents used for purification by reprecipitation were a system using dichloromethane/hexane and a system using dichloromethane/methanol.

As a result, 0.6 g (yield 27%) of a red orange solid was obtained (as calculated in terms of the molecular weight of 2857).

Second Embodiment

Compound for Organic EL

In Second Embodiment of the compound for an organic EL device according to an aspect of the invention, the polymer molecule represented by Formula (14) was prepared by a synthesis method on the basis of the following Synthetic Example.

(wherein the theoretical values for the synthesis reaction are as follows: m=1, n=4, p=4, a=2, b=2, and r=1, and molecular weight MW=3190)

Synthetic Example 5

Figure 5:
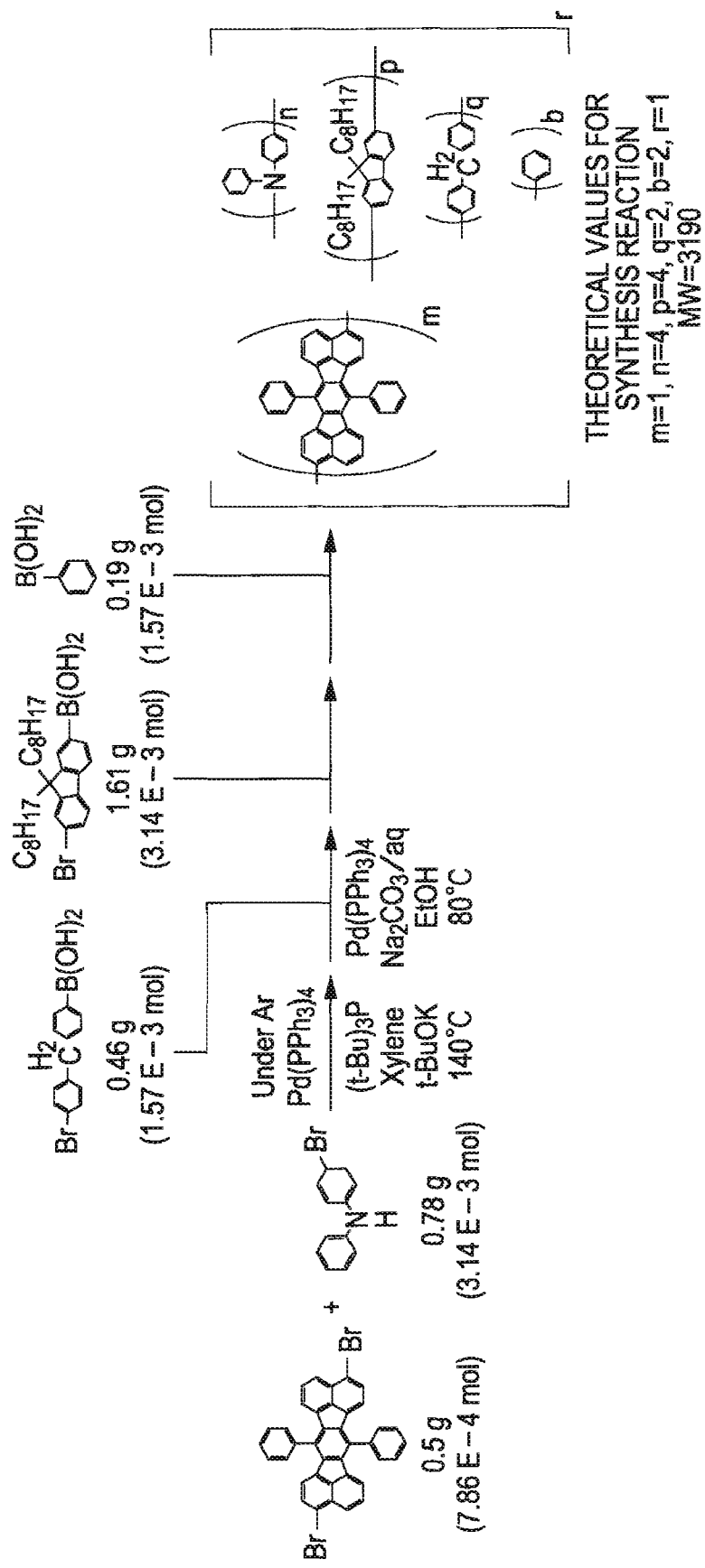
FIG. 5 is a view illustrating the synthesis method of Synthetic Example 5.

An EL material represented by Formula (14) (EL material 2) was synthesized by the synthesis route as shown in FIG. 5.

First, 0.5 g ($7.86 \times 10^{-4}$ mol) of diphenylacenaphtho[1,2-k]fluoranthene derivative which had been previously synthesized (in Synthetic Example 1), and 0.78 g ($3.14 \times 10^{-3}$ mol) of 4-bromodiphenylamine were added to a 300 cm$^3$ Schrenk tube that had been purged with Ar, and then 100 cm$^3$ of dry xylene was added thereto. The resulting solution was heated to 130° C.

Then, 0.1 g of a tetrakistriphenylphosphine palladium complex (Pd(PPh$_3$)$_4$), 0.3 g of t-butoxypotassium, and 0.1 g of tris-t-butylphosphine were added to the solution to perform a reaction in an oil bath at 140° C. for 5 hours. Five hours later, the solution was cooled to a temperature of 80° C., and 25 cm$^3$ of ethanol, and 50 cm$^3$ of a saturated, aqueous sodium carbonate solution were added to the solution. Thereafter, the solution was stirred for 15 minutes.

Thereafter, 0.46 g ($1.57 \times 10^{-3}$ mol) of 1-(4-bromobenzyl)-4-phenylboric acid (Synthetic Example 3), and 0.1 g of a tetrakistriphenylphosphine palladium complex (Pd(PPh$_3$)$_4$) were added to the solution to perform a reaction for an additional 4 hours. Four hours later, 1.61 g (3.14×10$^{-3}$ mol) of 2-bromo-9,9-di-n-octylfluorenyl-7-boric acid (Synthetic Example 2), and 0.1 g of a tetrakistriphenylphosphine palladium complex (Pd(PPh$_3$)$_4$) were further added to the solution to perform a reaction for 4 hours. Then, 0.19 g (1.57×10$^{-3}$ mol) of a commercially available phenylboric acid was added to the solution to perform a reaction for an additional 5 hours. During the reaction, a trace amount of Ar was continuously supplied to the solution to prevent the incorporation of oxygen and water.

After reaction, air was blown into the reaction solution via bubbling while heating the solution for 30 minutes. Then, the reaction solution was cooled to room temperature, and then transferred to a 1 liter separating lot, and sufficiently washed with distilled water while being extracted with toluene. The toluene layer in the separating lot was sufficiently dried over magnesium sulfate, and then purified by silica gel chromatography and reprecipitation. As the developing solvent for silica gel chromatography, xylene was used. The solvents used for purification by reprecipitation were a system using dichloromethane/hexane and a system using dichloromethane/methanol.

g (6.6×10$^{-5}$ mol) of bromobenzene were metered into a 200 cm$^3$ Schrenk tube that had been purged with Ar. 50 cm$^3$ of distilled ethanol, and 100 cm$^3$ of distilled toluene were added to the mixture, thereby obtaining a solution. Further, 0.56 g of a tetrakistriphenylphosphine palladium complex (Pd(PPh$_3$)$_4$), and 30 cm$^3$ of a saturated, aqueous sodium carbonate solution were added thereto to perform a reaction at 80° C. for 10 hours.

After reaction, the reaction solution was cooled to room temperature transferred to a 1 liter separating lot, and sufficiently washed with distilled water while being extracted with toluene. The toluene layer in the separating lot was sufficiently dried over magnesium sulfate, and then purified by silica gel chromatography and reprecipitation.

The solvents used for reprecipitation were a system using dichloromethane/hexane and a system using dichloromethane/methanol.

As a result, 2 g (yield 52%, calculated as a recovered amount) of a white solid was obtained.

Thereafter, the polymer molecule represented by Formula (16) was prepared as a host 2 by a synthesis method on the basis of the following Synthetic Example.

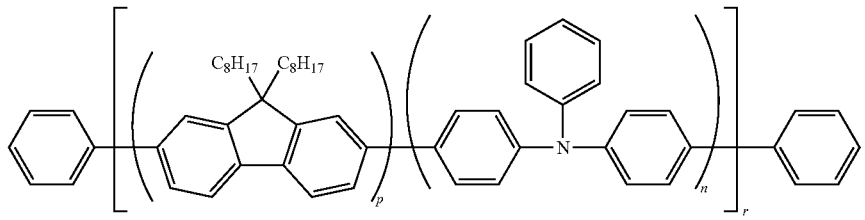

Formula (16)

As a result, 0.6 g (yield 24%) of a red solid was obtained (as calculated in terms of the molecular weight of 3190).

Thereafter, a host material for EL was synthesized and prepared in the following manner.

First, the polymer molecule represented by Formula (15) was prepared as a host 1 by a synthesis method on the basis of the following Synthetic Example.

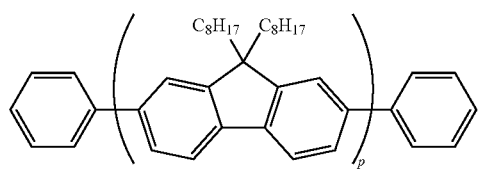

Formula (15)

(wherein the theoretical value for the synthesis reaction is as follows: p=150)

Synthetic Example 6

Figure 6:
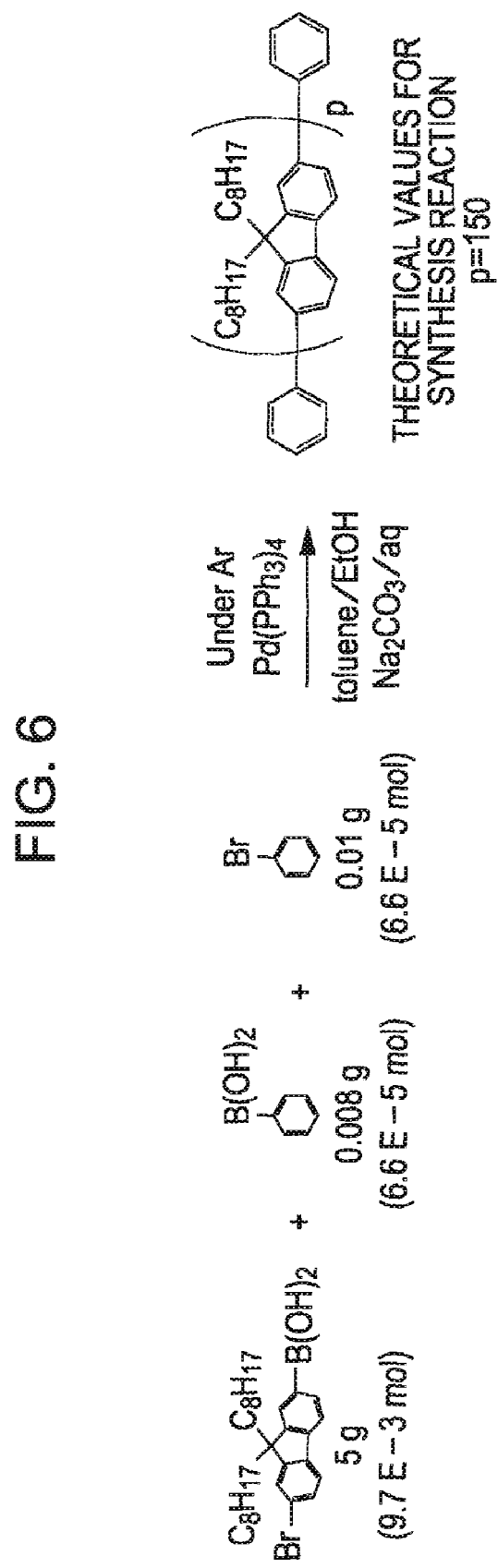
FIG. 6 is a view illustrating the synthesis method of Synthetic Example 6.

Polyfluorene represented by Formula (15) was synthesized as a host material for EL (host 1) in the following manner by a synthesis method as shown in FIG. 6.

First, 5 g (9.7×10$^{-3}$ mol) of 2-bromo-9,9-di-n octylfluorenyl-7-boric acid which had been previously synthesized by the above-described synthesis method, 0.008 g (6.6×10$^{-5}$ mol) of a commercially available phenylboric acid, and 0.01

(wherein the theoretical values for the synthesis reaction are as follows: p=3, n=1, and r=50)

Synthetic Example 7

Figure 7:
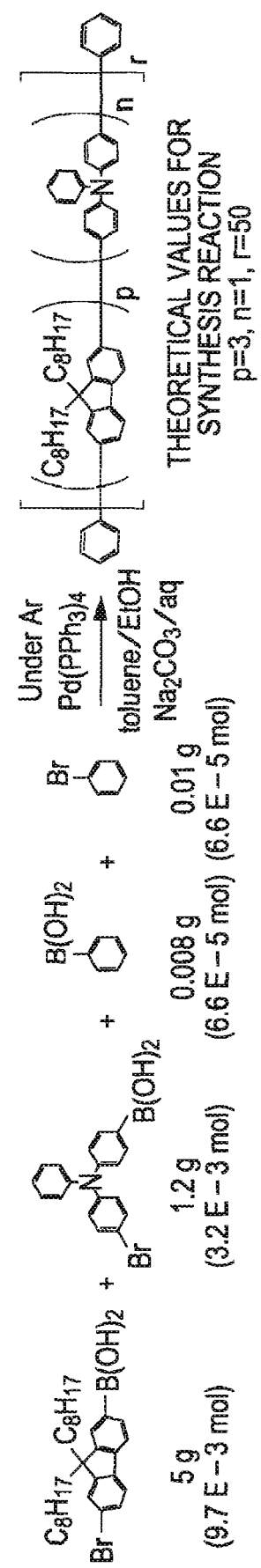
FIG. 7 is a view illustrating the synthesis method of Synthetic Example 7.

A copolymer of fluorine and triphenylamine represented by Formula (16) was prepared as a host material for EL (host 2) in the following manner by a synthesis method as shown in FIG. 7.

First, 5 g (9.7×10$^3$ mol) of 2-bromo-9,9-di-n-octylfluorenyl-7-boric acid which had been previously synthesized by the above-described synthesis method, 0.01 g (6.6×10$^{-5}$ mol) of 4-bromo-triphenylaminoboric acid, 1.2 g (3.2×10$^{-3}$ mol) of a commercially available phenylboric acid, and 0.008 g (6.6×10$^{-5}$ mol) of bromobenzene were metered into a 200 cm$^3$ Schrenk tube that had been purged with Ar. 50 cm$^3$ of distilled ethanol, and 100 cm$^3$ of distilled toluene were added to the mixture, thereby obtaining a solution. Further, 0.56 g of a tetrakistriphenylphosphine palladium complex (Pd(PPh$_3$)$_4$), and 30 cm$^3$ of a saturated, aqueous sodium carbonate solution were added thereto to perform a reaction at 80° C. for 5 hours.

After reaction, the reaction solution was cooled to room temperature, transferred to a 1 liter separating lot, and sufficiently washed with distilled water while being extracted with toluene. The toluene layer in the separating lot was sufficiently dried over magnesium sulfate, and then purified by silica gel chromatography and reprecipitation.

The solvents used for reprecipitation were a system using dichloromethane/hexane and a system using dichloromethane/methanol.

As a result, 1.5 g (yield 33%, calculated as a recovered amount) of a white solid was obtained.

Thereafter, the polymer molecule represented by Formula (17) was prepared as a host 3 by a synthesis method on the basis of the following Synthetic Example.

(PPh$_3$)$_4$), and 30 cm$^3$ of a saturated, aqueous sodium carbonate solution were added thereto to perform a reaction at 80° C. for 5 hours.

Five hours later, 0.2 g (1.65×10$^{-3}$ mol) of phenylboric acid was added to the solution to perform a reaction for an addi- Formula (17)

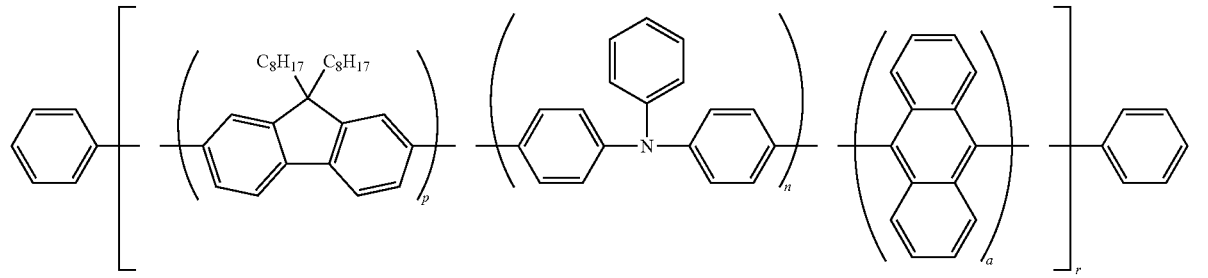

(wherein the theoretical values for the synthesis reaction are as follows: p=3, n=1, a=1, and r=50)

Synthetic Example 8

Figure 8:
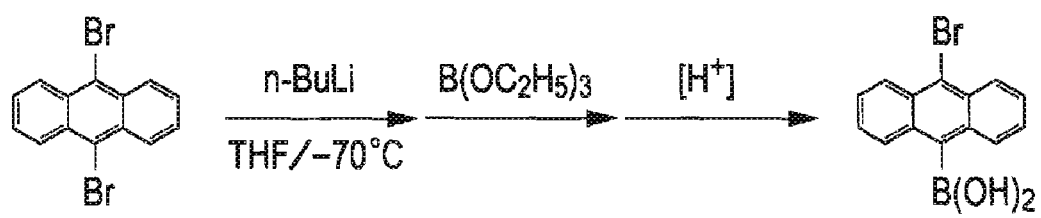
FIG. 8 is a view illustrating the synthesis method of Synthetic Example 8.
Figure 9:
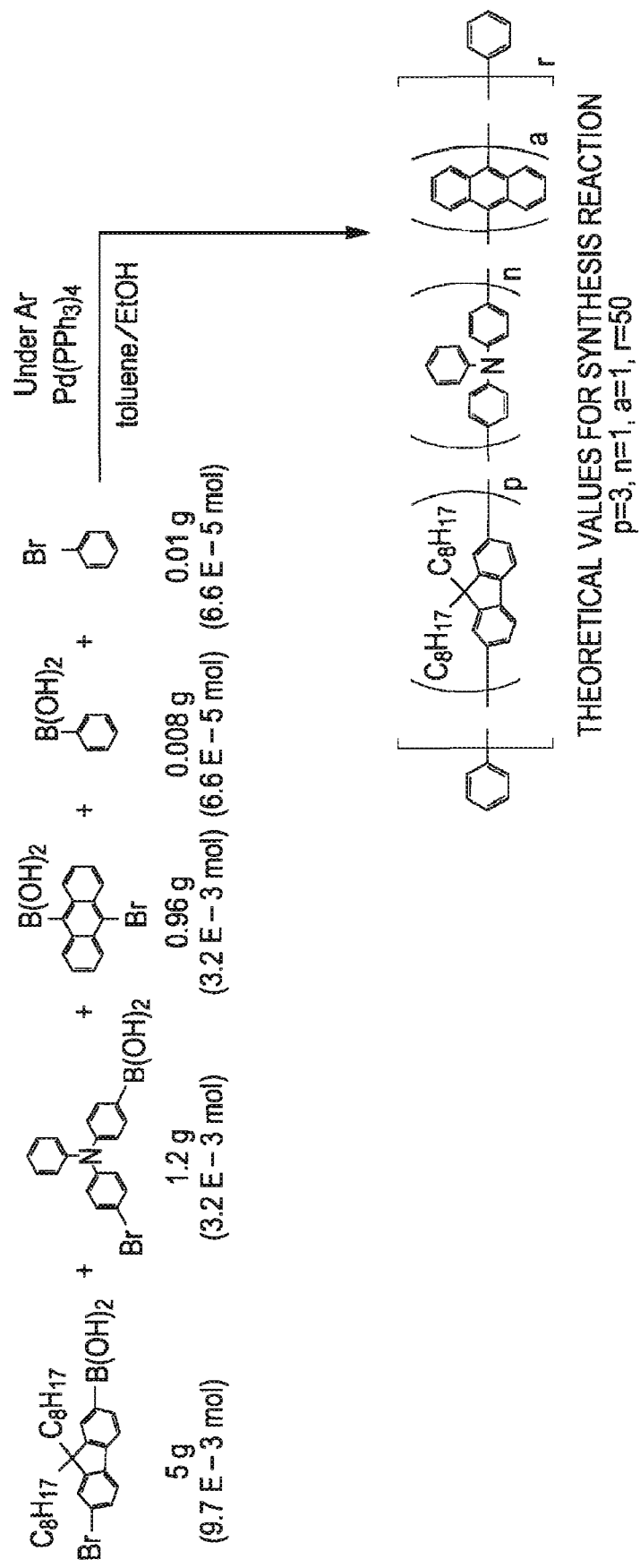
FIG. 9 is a view illustrating the synthesis method of Synthetic Example 8.

A copolymer of fluorine, triphenylamine, and anthracene represented by Formula (17) was prepared as a host material for EL (host 3) in the following manner by a synthesis method as shown in FIG. 8.

Synthesis of Raw materials: Synthesis of 9-Bromoanthracen-10-yl-boric acid

First, 2 g (5.9×10$^{-3}$ mol) of 9,10-dibromoanthracene, and 50 cm$^3$ of THF that had been dried odium were added to a 200 cm$^3$ Schrenk tube that had been purged with Ar, thereby obtaining a dispersed solution. This solution was cooled to 70° C. 4 cm$^3$ (5.9×10$^{-3}$ mol) of a solution of n-butyllithium in hexane was added to the solution, and left to stand for 1 hour. While cooling was continued, 0.87 g (5.9×10$^{-3}$ mol) of triethyl borate was added to the solution to perform a reaction for 1.5 hours. After reaction, 5 cm$^3$ of an aqueous 40% HCl solution was added to the reaction solution at 5° C. One hour later, 100 cm$^3$ of THF was added to the reaction solution, and completely dissolved, and then neutralized by setting pH to 7 with a saturated, aqueous sodium carbonate solution.

Then, the organic layer (THF layer) was separated using a separating lot. A suitable amount of magnesium sulfate was added to the separated THF solution to remove water. After removing magnesium sulfate using a filter paper, the solvent was removed using an evaporator, and hexane was added thereto precipitate a target product. Purification was carried out by a reprecipitation method. Further, THF and hexane were used as a solvent.

As a result, 1 g (yield 56%) of a pale yellow white (having a pale green color) solid was obtained.

Synthesis of Host Material

First, 5 g (9.7×10$^{-3}$ mol) of 2-bromo-9,9-di-n-octylfluorenyl-7-boric acid which had been previously synthesized by the above-described synthesis method, 1.2 g (3.2×10$^{-3}$ mol) of 4-bromo-triphenylaminoboric acid, 0.96 g (3.2×10$^{-3}$ mol) of 9-bromoanthracen-10-yl-boric acid, 0.008 g (6.6×10$^{-5}$ mol) of a commercially available phenylboric acid, and 0.01 g (6.6×10$^{-5}$ mol) of bromobenzene were metered into a 200 cm$^3$ Schrenk tube which had been purged with Ar. 50 cm$^3$ of distilled ethanol, and 100 cm$^3$ of distilled toluene were added to the mixture, thereby obtaining a solution. Further, 0.7 g of a tetrakistriphenylphosphine palladium complex (Pd tional 1 hour. One hour later, the reaction solution was cooled to room temperature, transferred to a 1 liter separating lot, and sufficiently washed with distilled water while being extracted with toluene. The toluene layer in the separating lot was sufficiently dried over magnesium sulfate, and then purified by silica gel chromatography and reprecipitation.

The solvents used for reprecipitation were a system using dichloromethane/hexane and a system using dichloromethane/methanol.

As a result, 2.1 g (yield 41%, calculated as a recovered amount) of a pale yellow white solid was obtained.

The EL materials 1 and 2 (the compounds for an organic EL according to an aspect of the invention) prepared by the above-described synthesis method were used as light-emitting dopant materials, and mixed with host materials (hosts 1, 2, and 3) for EL at a suitable ratio which will be described later, to obtain materials for forming a light-emitting layer in an organic EL device.

For details of the synthesis processes described above, see the following references.

REFERENCE MATERIALS FOR SYNTHESIS

Polymers for Advanced Technologies, 15(5), 266-269; 2004
Eur. Pat. Appl., 1298117, 2 Apr. 2003
Helvetica Chimica Acta, 85(7), 2195-2213; 2002
Organometallics, 20(24), 5162-5170; 2001
Journal of Organic Chemistry, 69(3), 987-990; 2004
Journal of Organic Chemistry, 62(3), 530-537; 1997
Indian Journal of Chemistry, Section B: Organic Chemistry Including Medicinal Chemistry, 22B(3), 225-9; 1983
Organic EL Device Next, one embodiment of the organic EL device according to an aspect of the invention is described with reference to FIG. 10.

Figure 10:
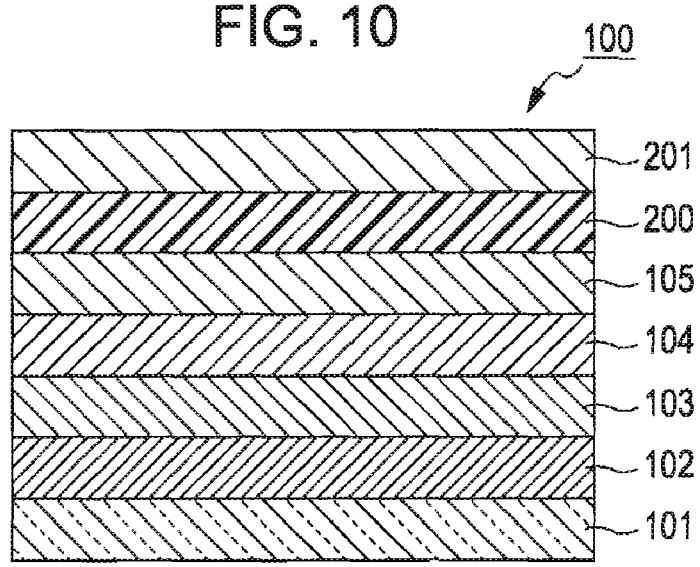
FIG. 10 is a schematic view illustrating an embodiment of an organic EL device according to an aspect of the invention.

In FIG. 10, Symbol 100 represents an organic EL device. This organic EL device 100 includes a light transmissive anode (first electrode) 102 and a cathode (second electrode) 105 on a light transmissive substrate 101, and a functional layer provided between the anode 102 and the cathode 105. The functional layer has a laminated structure composed of a hole Injecting/transporting layer 103, and a light-emitting layer 104. The organic EL device 100 having such the configuration is of a bottom-emission-type in which light emitted from the light-emitting layer 104 is emitted from the light transmissive substrate 101.

The substrate 101 is formed of driving elements including a TFT element and various wiring lines on a transparent substrate such as a glass substrate. The anode 102 is formed on these driving elements and various wiring lines via an insulative layer or a flattened film. The anode 102 is formed as patterned in each of the pixel regions formed on the substrate 101, and connected to the driving elements including a TFT element and various wiring lines. In the present embodiment, the anode 102 includes ITO.

The hole injecting/transporting layer 103 transports the holes injected from the anode 102 to the light-emitting layer 104, and is formed of 3,4-polyethylenedioxythiophene and polystyrene sulfonic acid (PEDOT/PSS). Further, the light-emitting layer 104 is formed of a material for forming a light-emitting layer including the compound for an organic EL, device according to an aspect of the invention, and includes a yellow light-emitting layer, in which the light-emitting wavelength band corresponds to a yellow color. According to the configuration described above, the organic EL device 100 realizes a yellow display in its entirety.

The cathode 105 is configured to cover the entire pixel region, in which a LiF layer, a Ca layer, and an Al layer are sequentially laminated on the light-emitting layer 104. Further, a sealing material 200 for adhering a sealing substrate 201 is formed on the cathode 15. The sealing material 200 is formed of a thermosetting resin or an ultraviolet-setting resin.

Then, one embodiment of the method of preparing the organic EL device 100 having such a configuration is described. This preparation method includes forming an anode; treating a substrate (plasma treatment); forming a hole injecting/transporting layer; forming a light-emitting layer; forming a cathode; and sealing.

Process of Forming Anode

A transparent substrate (not shown) formed of glass, etc. was prepared, and a thin film transistor (TFT) element, various wiring lines, and the like, which are not shown, were formed on the transparent substrate by a well-known method. Further, an insulative layer or a flattened film was formed between the layers, and then a film was formed on the entire surface of the substrate using indium tin oxide (ITO) by a sputtering method or a deposition method. Then, the film was patterned in each pixel by photolithography to obtain a pixel electrode (anode) 102. Further, as the pixel electrode 102, a light transmissive, conducting material may be used, and indium zinc oxide, or the like, in addition to ITO, may be used to form an anode.

Process of Treating Substrate

The glass substrate having the anode (pixel electrodes 102 formed thereon was ultrasonically washed with a neutral detergent, acetone, and ethanol, and dried by introducing it into boiling ethanol. Then, the surface of this transparent electrode was treated with plasma at an atmospheric pressure, and then the surface of the substrate was modified to be hydrophilic. Further, under an atmosphere, the substrate was set in a spin coating holder.

Process for Forming Hole Injecting/Transporting Layer

Next, a water dispersion of PEDOT/PSS (weight ratio=1: 2.5) (BAYTRON (registered trademark) P), manufactured by H. C. Starck, was spin-coated on the substrate having the anode (pixel electrode) 102 under an atmosphere, as a material for forming a hole infecting/transporting layer. Then, the spin-coated substrate was dried at 100° C. under nitrogen for 30 minutes to form a hole injecting/transporting layer 103. The film thickness after drying was 50 nm.

Process for Forming Light Emitting Layer

As a material for forming the light-emitting layer 104, a material formed of the EL materials 1 and 2 (light-emitting dopant materials) and the host materials 1, 2, and 3 for EL (host materials), prepared in the previous Embodiment, Which are the compounds for an organic EL according to an aspect of the invention, were prepared. The material having the EL materials 1 and 2 (light-emitting dopant materials) and the host materials 1, 2, and 3 for EL (host materials) in combination are shown for Examples 1 to 6 in Table 1. Further, for comparison, the material for forming the light-emitting layer, formed of the host materials 1, 2, and 3 for EL (host materials) only are shown for Comparative Examples 1 to 3.

Furthermore, the EL materials 1 and 2 (light-emitting dopant materials) and the host materials 1, 2, and 3 for EL (host materials) were mixed at a suitable ratio, and dissolved in a solvent to form a solution (ink). This solution was used to form a film on the hole injecting/transporting layer 103, for example, to a film thickness of 100 nm, by a spin coating method. As a result, the light-emitting layer 104 was formed. At this times after forming a film by coating, the film was dried at 100° C. under nitrogen for 30 minutes. Further, when the solution was used to form a film, the hole injecting/transporting layer 103 was not compatible therewith.

Otherwise, the solution may be used to form a film by a liquid droplet discharge method (ink jet method), instead of a spin coating method.

Process for Forming Cathode

After forming the light-emitting layer 104, by using a vacuum deposition device, the vacuum pressure was set at $10^{-7}$ to $10^{-8}$ Torr, and LiF with a thickness of 1 nm, Ca with a thickness of 5 nm, and Al with a thickness of 200 nm were sequentially laminated to form a cathode 105.

Sealing Process

Finally, in the sealing process, a sealing material 200 formed of a thermosetting resin or an ultraviolet-setting resin was coated on the entire surface of the cathode 105 to form a sealing layer. Further, a sealing substrate 201 was conjugated on the sealing layer (sealing material 200). This sealing process is preferably carried out under an inert gas atmosphere such as nitrogen, argon, or helium.

As a result, the organic EL device 100 as shown in FIG. 10 is obtained.

In this organic EL device 100, by using the compound for an organic EL device according to an aspect of the invention to form the light-emitting layer 104, the light-emitting characteristics (luminance) and reliability (luminance half life) were improved, as compared with the experiment results to be described later. Accordingly, it promotes higher luminous efficiency and longer life time, as compared with the devices according to the related art.

Examples 1 to 6, and Comparative Examples 1 to 3

As described above, as a material for forming the light-emitting layer 104, the materials shown in Table 1 were used.

TABLE 1

|  | Host material | Light emitting material | Color (CIE 1931) | Luminance (cd/m²) (100 mA/cm²) | Required voltage (V) (100 mA/cm²) | Luminance half life time (hr) (100 mA/cm²) |
|---|---|---|---|---|---|---|
| Example 1 | Host 1 | EL material 1 | (0.57, 0.42) | 4400 | 6.0 | 80 |
| Example 2 | Host 1 | EL material 2 | (0.59, 0.41) | 4300 | 5.9 | 70 |
| Example 3 | Host 2 | EL material 1 | (0.57, 0.42) | 4500 | 6.1 | 100 |
| Example 4 | Host 2 | EL material 2 | (0.59, 0.41) | 4400 | 6.0 | 100 |
| Example 5 | Host 3 | EL material 1 | (0.57, 0.42) | 4700 | 5.8 | 110 |
| Example 6 | Host 3 | EL material 2 | (0.59, 0.41) | 4600 | 5.8 | 100 |
| Comparative Example 1 | Host 1 | None | (0.17, 0.14) | 500 | 6.0 | 20 |
| Comparative Example 2 | Host 2 | None | (0.16, 0.04) | 650 | 5.8 | 35 |
| Comparative Example 3 | Host 3 | None | (0.15, 0.09) | 900 | 5.7 | 45 |

As used herein, in Example 1, the (EL material 1) represented by Formula (13), and the (host 1) represented by Formula (15) were used at a mixing ratio of 1:7.2 (weight ratio), and dissolved In chloroform to obtain a solution (ink) having a solid content of 1.5 wt %. Further, by using the solution (ink), the light-emitting layer 104 was formed by a spin coating method as described above. As a result, an organic EL device as a product according to Example 1 was obtained.

In Example 2, the (EL material 2) represented by Formula (14), and the (host 1) represented by Formula (15) were used at a mixing ratio of 1:6.5 weight ratio), and dissolved in chloroform to obtain a solution (ink) having a solid content of 1 wt %. Further, by using the solution (ink), the light-emitting layer 104 was formed as described above. As a result, an organic EL device as a product according to Example 2 was obtained.

In Example 3, the (EL material 1) represented by Formula (13), and the (host 2) represented by Formula (16) were used at a mixing ratio of 1:7.2 (weight ratio), and dissolved in chloroform to obtain a solution (ink) having a solid content of 1.5 wt %. Further, by using the solution (ink), the light-emitting layer 104 was formed as described above. As a result, an organic EL device as a product according to Example 3 was obtained.

In Example 4, the (EL material 2) represented by Formula (14), and the (host 2) represented by Formula (16) were used at a mixing ratio of 1:6.5 (weight ratio), and dissolved in chloroform to obtain a solution (ink) having a solid content of 1.5 wt %. Further, by using the solution (ink), the light-emitting layer 104 was formed as described above. As a result, an organic EL device as a product according to Example 4 was obtained.

In Example 5, the (EL, material 1) represented by Formula (13), and the (host 3) represented by Formula (17) were used at a mixing ratio of 1:7.2 (weight ratio), and dissolved in chloroform to obtain a solution (ink) having a solid content of 1.5 wt %. Further, by using the solution (ink), the light-emitting layer 104 was formed as described above. As a result, an organic EL device as a product according to Example 5 was obtained.

In Example 6, the (EL material 2) represented by Formula (14), and the (host 3) represented by Formula (17) were used at a mixing ratio of 1:6.5 (weight ratio), and dissolved in chloroform to obtain a solution (ink having a solid content of 1.5 wt %. Further, by using the solution (ink), the light-emitting layer 104 was formed as described above. As a result, an organic EL device as a product according to Example 6 was obtained.

Furthermore, in Comparative Example 1, the (host 1) represented by Formula (15) was only used, and dissolved in chloroform to obtain a solution (ink) having a solid content of 1.5 wt %. Further, by using the solution (ink), the light-emitting layer 104 was formed as described above. As a result, an organic EL device as a product according to Comparative Example 1 was obtained.

In Comparative Example 2, the (host 2) represented by Formula (16) was only used, and dissolved in chloroform to obtain a solution (ink) having a solid content of 1.5 wt %. Further, by using the solution (ink), the light-emitting layer 104 was formed as described above. As a result, an organic EL device as a product according to Comparative Example 2 was obtained.

In Comparative Example 3, the (host 3) represented by Formula (17) was only used, and dissolved in chloroform to obtain a solution (ink) having a solid content of 1.5 wt %. Further, by using the solution (ink), the light-emitting layer 104 was formed as described above. As a result, an organic EL device as a product according to Comparative Example 3 was obtained.

Evaluation of Device

For each of the above-described organic EL devices, a voltage was applied to the light-emitting layer 104 so as to make a direct current of 100 mA/cm² flow, thereby causing light to be emitted.

Figure 11:
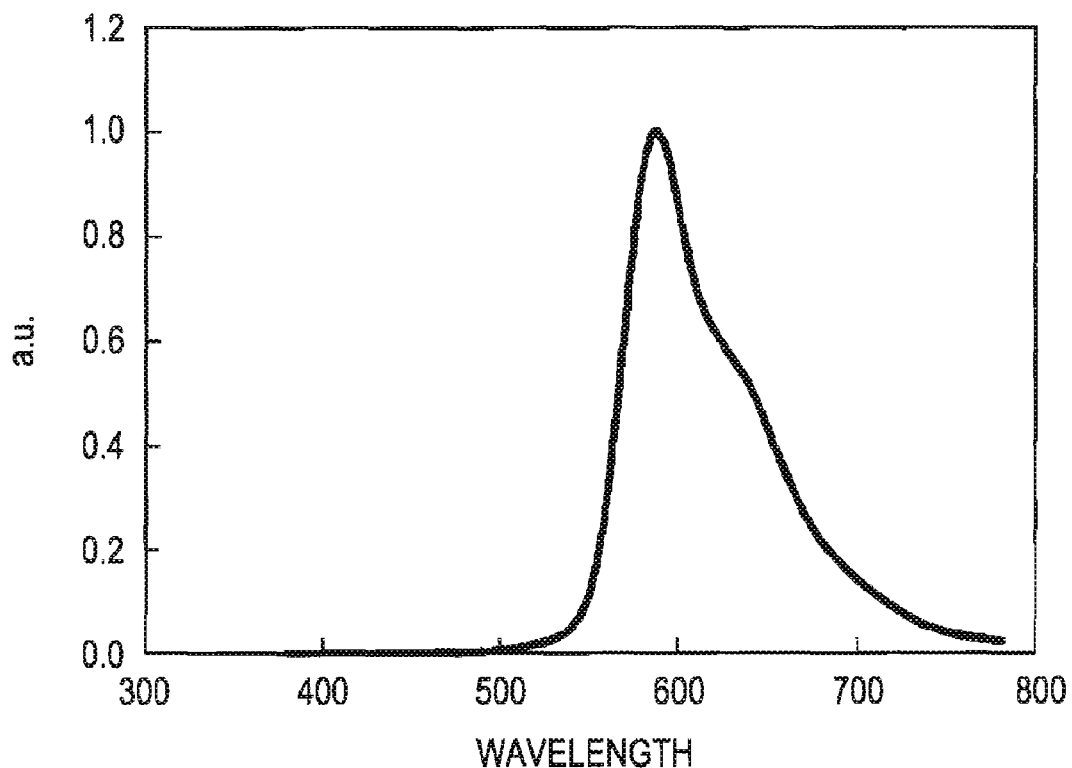
FIG. 11 is a graph illustrating the EL waveforms obtained from the light emission by an organic EL device.
Figure 12:
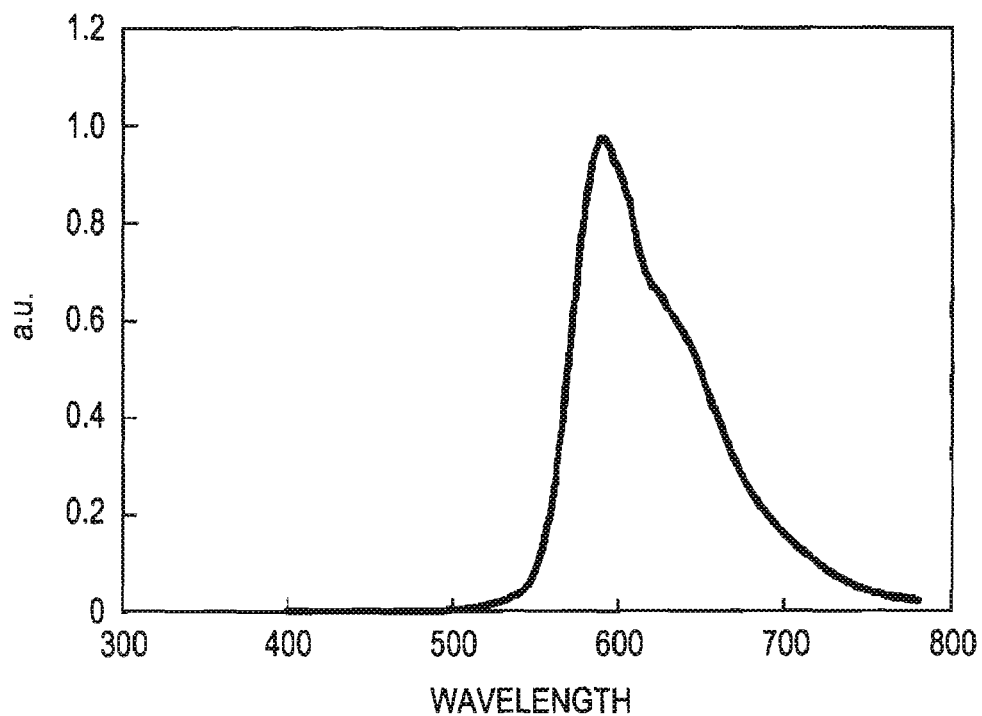
FIG. 12 is a graph illustrating the EL waveforms obtained from the light emission by an organic EL device.
Figure 13:
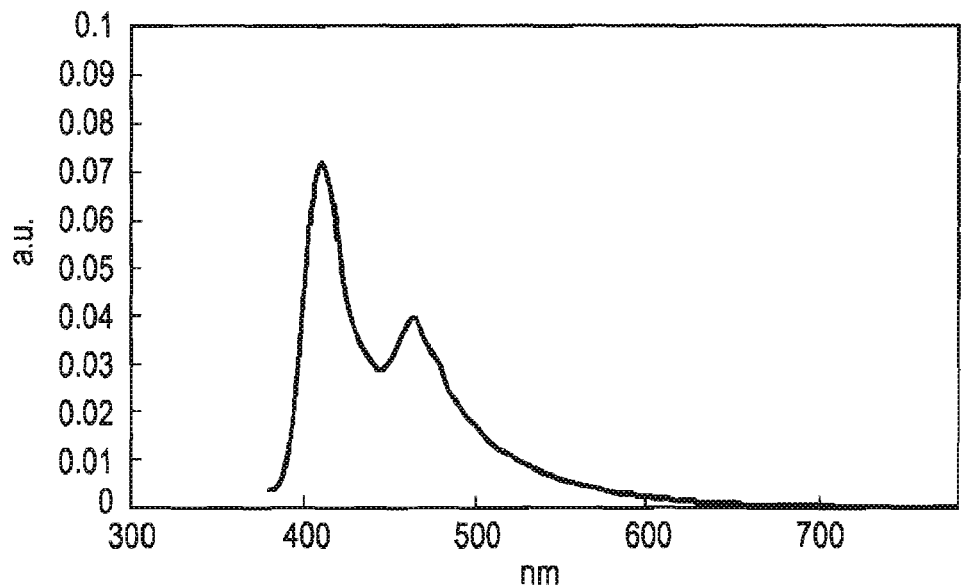
FIG. 13 is a graph illustrating the EL waveforms obtained from the light emission by an organic EL device.
Figure 14:
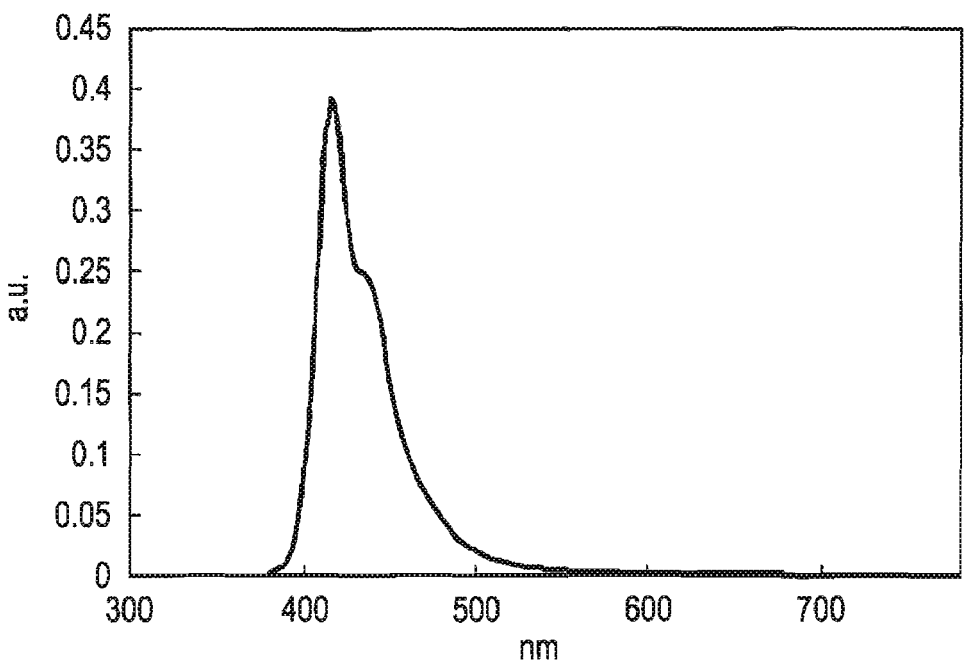
FIG. 14 is a graph illustrating the EL waveforms obtained from the light emission by an organic EL device.
Figure 15:
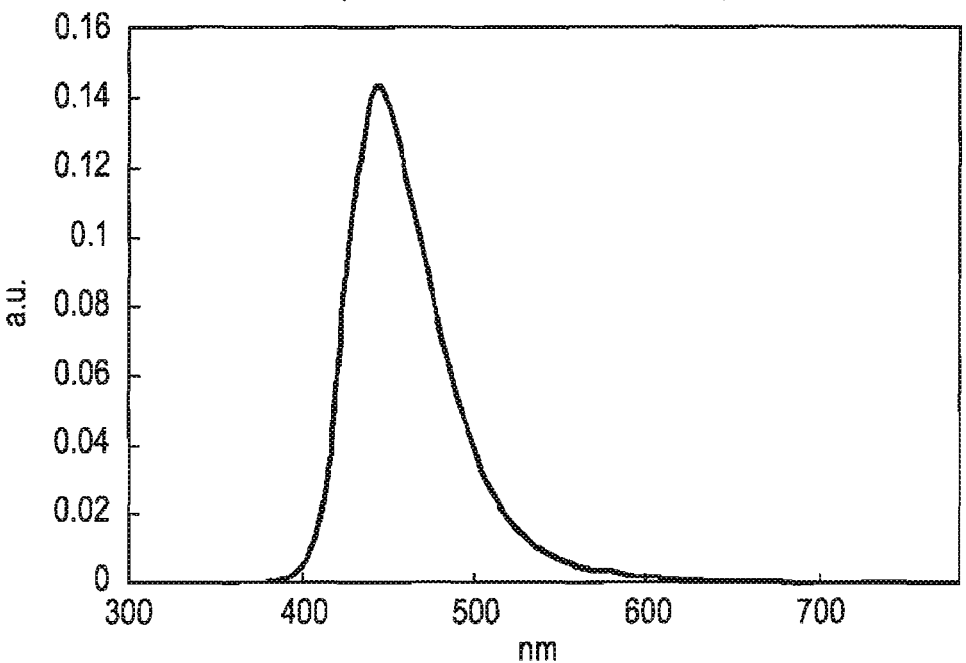
FIG. 15 is a graph illustrating the EL waveforms obtained from the light emission by an organic EL device.

The EL waveforms are shown in FIGS. 11 and 12. In FIG. 11, the EL waveforms in Examples 1, 3, and 5 are shown; and in FIG. 12, the EL waveforms in Examples 2, 4, and 6 are shown. Further, in FIG. 13, the EL waveform in Comparative Example 1 is shown in FIG. 14, the EL waveform in Comparative Example 2 is shown; and in FIG. 15, the EL waveform in Comparative Example 3 is shown.

Furthermore, the color, the luminance, and the luminance half life (time taken for the initial luminance to be reduced to a half thereof) of the obtained emitted light, were measured, and the results are shown in Table 1.

Further, in Example 1, the applied voltage for obtaining the above-described current was 6.0 V.

Similarly, in Example 2, the applied voltage was 5.9 V; in Example 3, the applied voltage was 6.1 V; in Example 4, the applied voltage was 6.0 V; in Example 5, the applied voltage was 5.8 V; in Example 6, the applied voltage was 5.8 V; in Comparative Example 1, the applied voltage was 6.0 V; in Comparative Example 2, the applied voltage was 5.8 V; and in Comparative Example 3, the applied voltage was 5.7 V.

In the above-described results, the organic EL device including the light-emitting layer 104 formed by using the compound for an organic EL device according to the First Embodiment or the Second Embodiment of the invention has excellent luminance, or luminance half life, as compared with the products of the Comparative Examples, and thus it was found that It has excellent light-emitting characteristics (luminance) and reliability (luminance half life).

Third Embodiment

Compound for Organic EL

In Third Embodiment of the compound for an organic EL device according to an aspect of the invention, the polymer molecule represented by Formula (18) was prepared by a synthesis method on the basis of the following Synthetic Example.

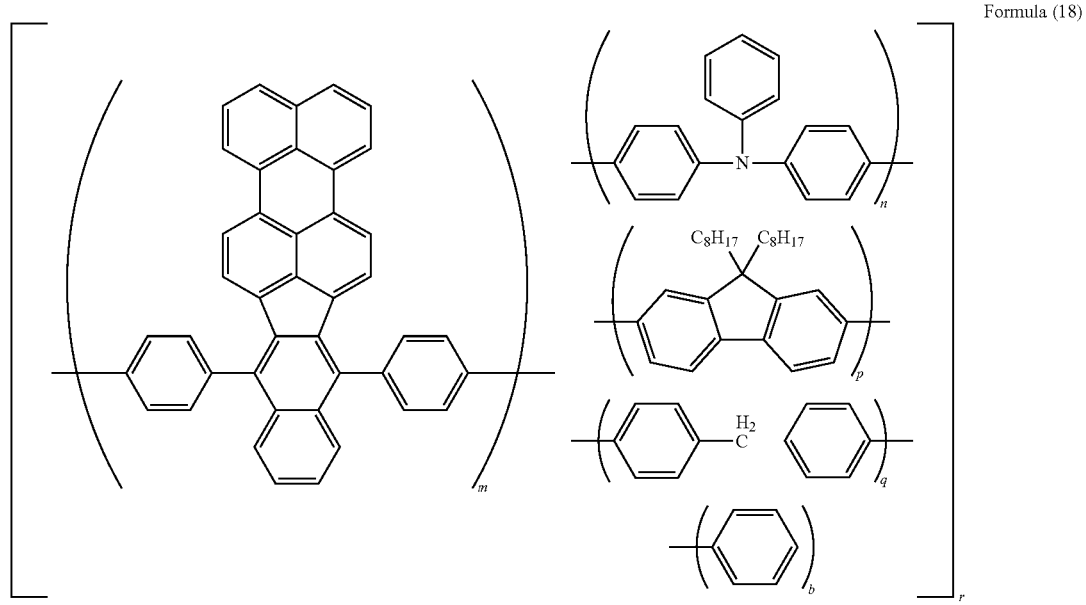

Formula (18)

(wherein the theoretical values for the synthesis reaction are as follows: m=1, n=2, p=4, q=0, b=2, and r=1, molecular weight MW=2722)

Synthetic Example 9

Figure 16:
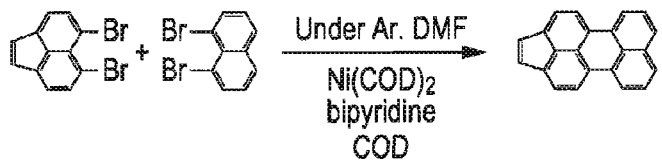
FIG. 16 is a view illustrating the synthesis method of Synthetic Example 9.

A perylene derivative (intermediate) was synthesized and prepared in the following manner by a synthesis method as shown in FIG. 16.

First, 150 cm$^3$ of dimethylformamide (DMF) that had been dried as a solvent was introduced into a 500 cm$^3$ Schrenk tube that had been purged with Ar, and 17.18 g (6.45×10$^{-2}$ mole of Ni(COD)$_2$, 10.08 g (6.45×10 mol) of 2,2'-bipyridine, and cyclooctadiene (3 cm$^3$) were added thereto. The mixture was warmed at 70° C. for 0.5 hour.

0.5 hour later, 10 g (3.23×10$^{-2}$ mol) of 5,6-dibromoacenaphthalene, and 9.23 g (3.23×10$^{-2}$ mol) of 1,8-dibromonaphthalene were added thereto to perform a reaction at 90° C.

After performing a reaction for 5 hours, the reaction solution was cooled to room temperature, and 50 cm$^3$ of methanol, and 30 cm$^3$ of 10% aqueous hydrochloric acid were added thereto. The precipitate was recovered by filtration, and then sufficiently washed with water and methanol.

Water was dissolved in 300 cm$^3$ of chloroform, and a target product was separated using silica gel. As a developing solvent, hexane and toluene were used.

Further, purification was carried out by reprecipitation using dichloromethane, and hexane.

As a result, 1.5 g (yield 16.8%) of a dark red solid was obtained. It was found that MS$^+$ was 276.

Synthetic Example 10

Figure 17:
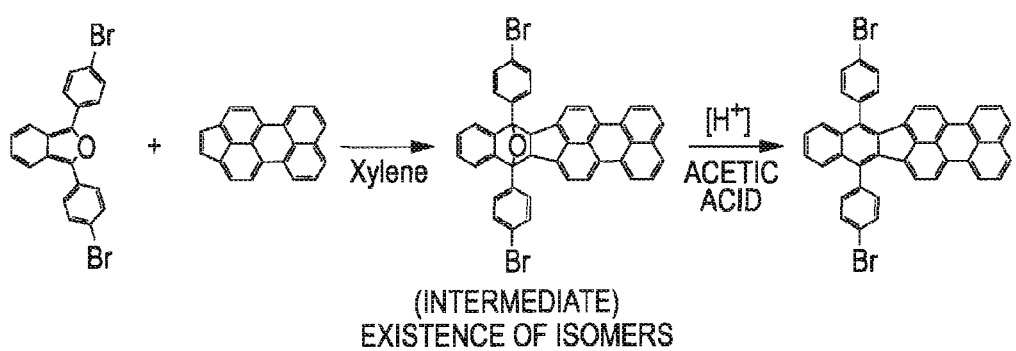
FIG. 17 is a view illustrating the synthesis method of Synthetic Example 10.

Bisbromophenyl-benzoindenoperylene was synthesized in the following manner by a synthesis method as shown in FIG. 17.

First, 1.29 g (4.67×10$^{-3}$ mol) of the perylene intermediate which had been previously synthesized, 2 g (4.67×10$^{-3}$ mol) of 1,3-bis-4-bromophenyl-isobenzofurane, and 50 cm$^3$ of xylene which had been dried by distillation were introduced to a 100 cm$^3$ Schrenk tube that had been purged with Ar to perform a reaction at 130° C. for 20 hours.

After reaction, the mixture was left to stand, and then cooled, and thus a precipitated target intermediate was filtered. The filtrate was washed with 300 cm$^3$ of heated chloroform, and then a target intermediate was recovered.

As a result, 1.5 g (yield 45%) of a yellow solid as am intermediate was obtained.

Then, 1.5 g of the intermediate was introduced to a 300 cm$^3$-flask, and 150 cm$^3$ of acetic acid was introduced thereto. The mixture was heated at 130° C. for 1 hour. After heating, the mixture was cooled to 100° C., and then 20 cm$^3$ of an aqueous 48% HBr solution was added thereto. After heating the solution for 30 minutes, water was introduced thereto to recover a solid content.

The solid content was sufficiently washed with distilled water and methanol, and a target product was separated and purified by silica gel chromatography and a reprecipitation method.

As a result, 0.8 g (yield 54%) of a red solid was obtained. It was found that MS$^{++1}$ was 684.

Synthetic Example 11

Figure 18:
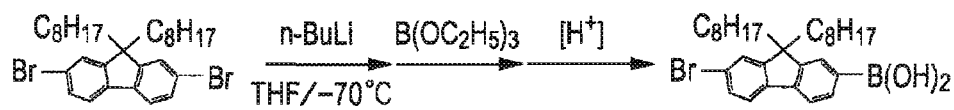
FIG. 18 is a view illustrating the synthesis method of Synthetic Example 11.

2-Bromo-9,9-di-n-octylfluorenyl-7-boric acid was synthesized in the following manner by a synthesis method as shown in FIG. 18.

First, 4 g (7.3×10$^{-3}$ mol) of 2,7-dibromo-9,9-di-n-octylfluorene, and 100 cm$^3$ of THF that had been dried over sodium were added to a 200 cm³ Schrenk tube that had been purged with Ar, thereby obtaining a solution. This solution was cooled to −70° C. 4.9 cm³ of a 1.5 mol/l solution of n-butyllithium in hexane was added to the solution, and left to stand for 1 hour. While cooling was continued, 1.1 g (7.5× $10^{-3}$ mol) of triethyl borate was added to the solution to perform a reaction for 1.5 hours. After reaction, 5 cm³ of an aqueous 40% HCl solution was added to the reaction solution at 5° C. One hour later, the reaction solution was neutralized by setting pH to 7 with a saturated, aqueous sodium carbonate solution.

Then, the organic layer (THF layer) was separated using a separating lot. A suitable amount of magnesium sulfate was added to the separated THF solution to remove water. After removing magnesium sulfate using a filter paper, hexane was added to the solution to precipitate a target product. Purification was carried out by a reprecipitation method. THF and hexane were used as the solvents.

Synthetic Example 12

Figure 19:
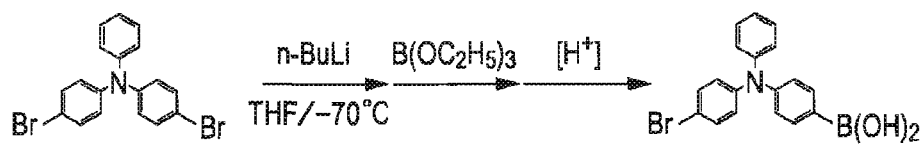
FIG. 19 is a view illustrating the synthesis method of Synthetic Example 12.

4-Bromo-triphenylaminoboric acid was synthesized in the following manner by a synthesis method as show in FIG. 19.

First, 4 g (9.9×$10^{-3}$ mol of a commercially available 4,4'-dibromo-triphenylamine, and 100 cm³ of THF that had been dried over sodium were added to a 200 cm³ Schrenk tube that had been surged with Ar, thereby obtaining a solution. This solution was cooled to −70° C. 9.9 cm³ (1.48×$10^{-2}$ mol) of a 1.5 mol/l solution of n-butyllithium in hexane was added to the solution, and left to stand for hour. While cooling was continued, 1.9 g (1.3×$10^{-2}$ mol) of triethyl borate was added to the solution to perform a reaction for 1.5 hours. After reaction, 5 cm³ of an aqueous 40% HCl solution was added to the reaction solution at 5° C. One hour later, the reaction solution was neutralized by setting pH to 7 with a saturated, aqueous sodium carbonate solution.

Then, the organic layer (THF layer) was separated using a separating lot. A suitable amount of magnesium sulfate was added to the separated THF solution to remove water. After removing magnesium sulfate using a filter paper, hexane was added to the solution to precipitate a target product. Purification was carried out by a reprecipitation method. THF and hexane were used as the solvents.

As a result, 1.4 g (yield 40%) of a white (having a pale green color) solid was obtained.

Synthetic Example 13

Figure 20:
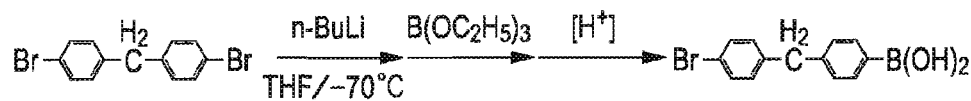
FIG. 20 is a view illustrating the synthesis method of Synthetic Example 13.

1-(4-Bromobenzyl)-4-phenylboric acid was synthesized in the following manner by a synthesis method as shown in FIG. 20.

First, 5 g (1.5×$10^{-2}$ mol) of 4,4-bisbromophenylmethane, and 50 cm³ of THF that had been dried over sodium were added to a 200 cm³ Schrenk tube that had been purged with Ar, thereby obtaining a solution. This solution was cooled to −70° C. 10.2 cm³ (1.5×$10^{-2}$ mol) of a 1.5 mol/l solution of n-butyllithium in hexane was added to the solution, and left to stand for 1 hour. While cooling was continued, 2.2 g (1.5× $10^{-2}$ mol) of triethyl borate was added to the solution to perform a reaction for 1.5 hours. After reaction, 5 cm³ of an aqueous 40% HCl solution was added to the reaction solution at 5° C. One hour later, the reaction solution was neutralized by setting pH to 7 with a saturated, aqueous sodium carbonate solution.

Then, the organic layer (THF layer) was separated using a separating lot. A suitable amount of magnesium sulfate was added to the separated THF solution to remove water. After removing magnesium sulfate using a filter paper, and then the solvent was removed using an evaporator.

As a result, 4 g of a transparent thick product was obtained, which would be used for a subsequent reaction.

Synthetic Example 14

Figure 21:
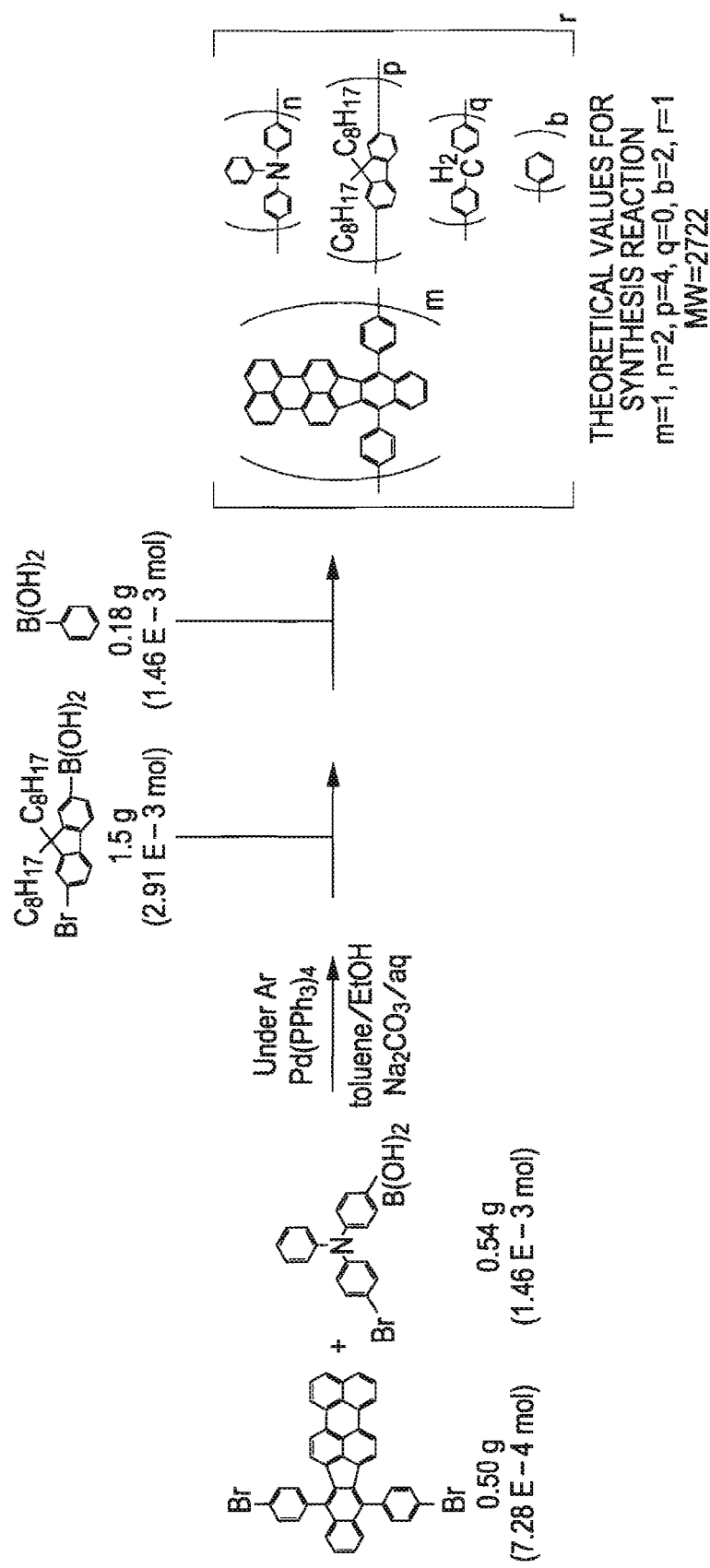
FIG. 21 is a view illustrating the synthesis method of Synthetic Example 14.

An EL material represented by Formula (18) (EL material 3), that is, the compound for an organic EL device according to Third Embodiment of the invention, was synthesized by the synthesis route as shown in FIG. 21.

First, 0.5 g (7.28×$10^{-4}$ mol) of the indenoperylene derivative which had been previously synthesized (in Synthetic Example 1), and 0.54 g (1.46×$10^{-3}$ mol) of 4-bromo-triphenylaminoboric acid were added to a 200 cm³ Schrenk tube that had been purged with Ar. Then, 50 cm³ of distilled ethanol, and 100 cm³ of distilled toluene were added to the mixture, thereby obtaining a solution.

Then, 0.06 g of a tetrakistriphenylphosphine palladium complex (Pd(PPh$_3$)$_4$) and 30 cm³ of a saturated, aqueous sodium carbonate solution were added thereto to perform a reaction at 80° C. Cone hour later, 1.5 g (2.91×$10^{-3}$ mol) of 2-bromo-9,9-di-n-octylfluorenyl-7-boric acid, and 0.06 g of a tetrakistriphenylphosphine palladium complex (Pd(PPh$_3$)$_4$) were added thereto to perform a reaction for 5 hours.

Thereafter, 0.18 g (1.46×$10^{-3}$ mol) of a commercially available phenylboric acid was added to the solution to perform a reaction for an additional 5 hours. After reaction, air was blown into the reaction solution via bubbling while heating the solution for 30 minutes. Then, the reaction solution was cooled to room temperature, and then transferred to a 1 liter separating lot, and sufficiently washed with distilled water while being extracted with toluene. The toluene layer in the separating lot was sufficiently dried over magnesium sulfate, and then purified by silica gel chromatography and reprecipitation.

The solvents used for reprecipitation were a system using dichloromethane/hexane and a system using dichloromethane/methanol.

As a result, 0.5 g (yield 25%) of a red solid was obtained (as calculated in terms of the molecular weight of 2722).

Fourth Embodiment

In Fourth Embodiment of the compound for an organic EL device according to an aspect of the invention, the polymer molecule represented by Formula (19) was prepared by a synthesis method on the basis of the following Synthetic Example.

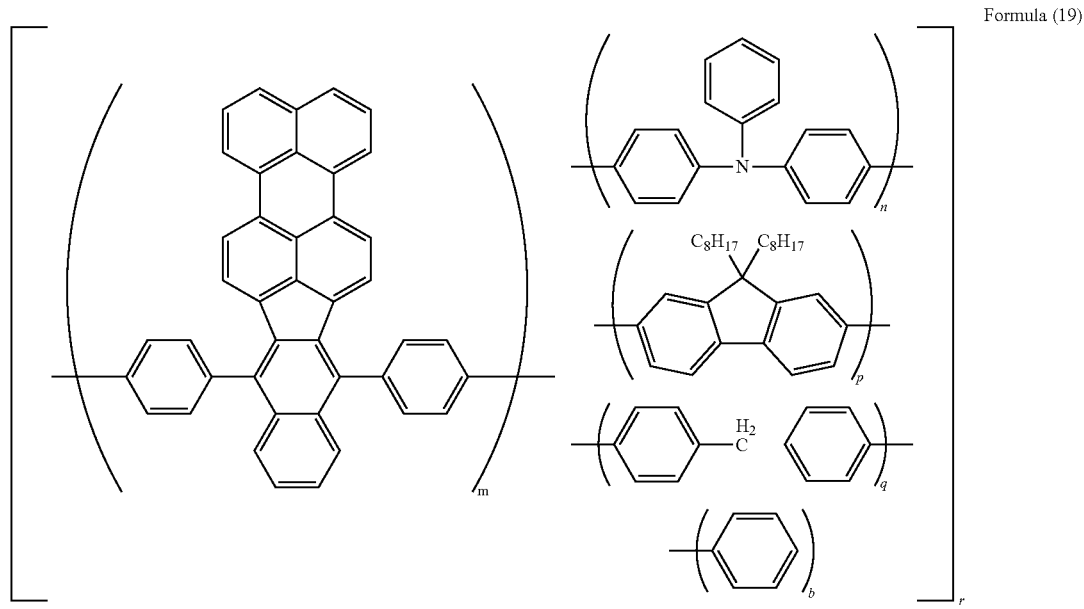

Formula (19)

(wherein the theoretical values for the synthesis reaction are as follows: m=1, n=2, p=4, q b=2, and r=1, and molecular weight MW=3054)

Synthetic Example 15

Figure 22:
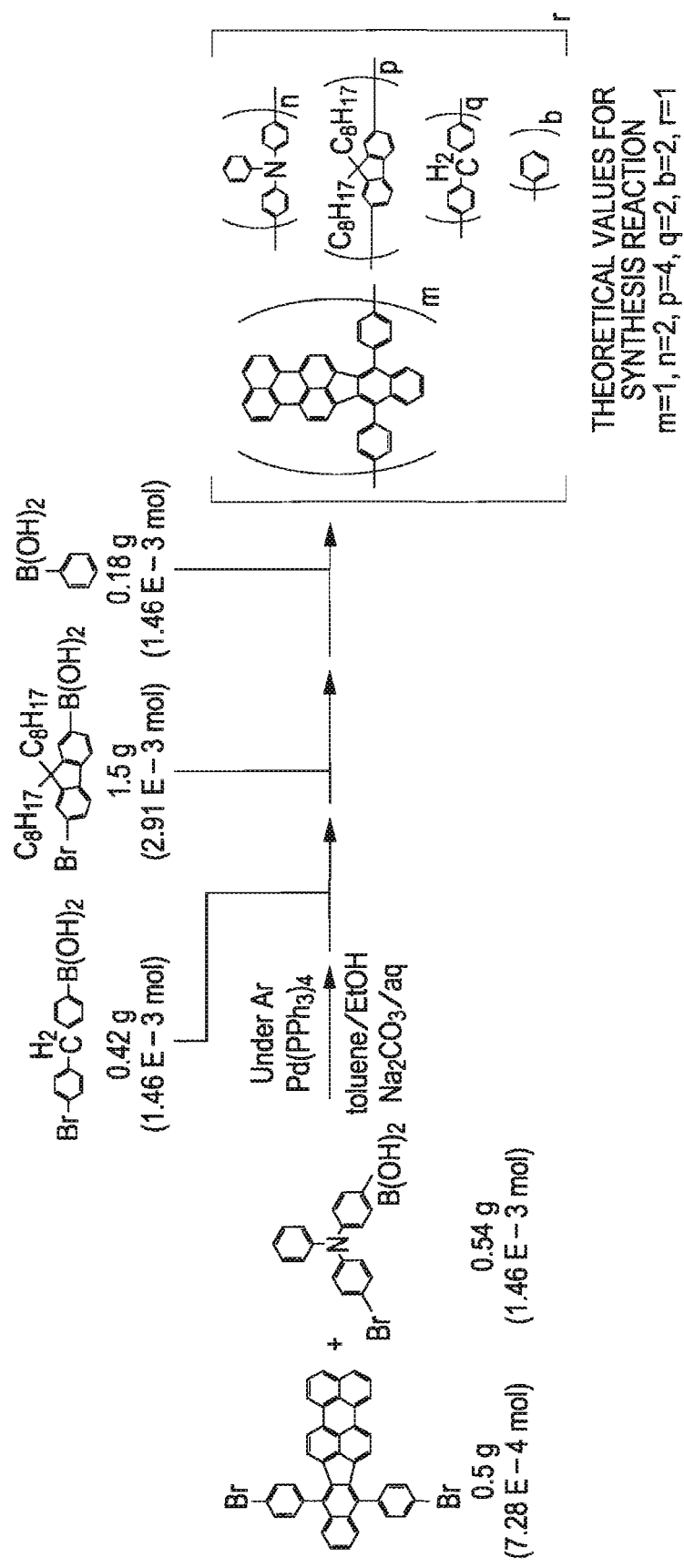
FIG. 22 is a view illustrating the synthesis method of Synthetic Example 15.

An EL material represented by Formula (19) (EL material 4) was synthesized by the synthesis route as shown in FIG. 22.

First, 0.5 g ($7.28 \times 10^{-4}$ mol) of the indenoperylene derivative which had been previously synthesized (in Synthetic Example 1), and 0.54 g ($1.46 \times 10^{-3}$ mol) of 4-bromo-triphenylaminoboric acid were added to a 200 cm³ Schrenk tube that had been purged with Ar. Then, 50 cm³ of distilled ethanol, and 100 cm³ of distilled toluene were added to the mixture, thereby obtaining a solution.

Then, 0.06 g of a tetrakistriphenylphosphine palladium complex ($Pd(PPh_3)_4$), and 30 cm³ of a saturated, aqueous sodium carbonate solution were added thereto to perform a reaction at 80° C. One hour later, 0.42 g ($1.46 \times 10^{-3}$ mol) of 1-(4-bromobenzyl)-4-phenylboric acid, and 0.06 g of a tetrakistriphenylphosphine palladium complex ($Pd(PPh_3)_4$) were added thereto to perform a reaction. Two hours lager, 1.5 g ($2.91 \times 10^{-3}$ mol) of 2-bromo-9,9-di-n-octylfluorenyl-7-boric acid, and 0.06 g of a tetrakistriphenylphosphine palladium complex ($Pd(PPh_3)_4$) were added thereto to perform a reaction for 5 hours.

Thereafter, 0.1 g ($1.04 \times 10^{-3}$ mol) of a commercially available phenylboric acid was added to the solution to perform a reaction for an additional 5 hours. After reaction, air was blown into the reaction solution via bubbling while heating the solution for 30 minutes. Then, the reaction solution was cooled to room temperature, and then transferred to a 1 liter separating lot, and sufficiently washed with distilled water while being extracted with toluene. The toluene layer in the separating lot was sufficiently dried over magnesium sulfate, and then purified by silica gel chromatography and reprecipitation.

The solvents used for reprecipitation were a system using dichloromethane/hexane and a system using dichloromethane/methanol.

As a result, 0.4 g (yield 18%) of a red solid was obtained (as calculated in terms of the molecular weight of 3054).

For details of the synthesis processes described above, see the following references.

REFERENCE MATERIALS FOR SYNTHESIS

J. Am. Chem. Soc. 118, 2374-2379 (1996)
Polymers for Advanced Technologies, 15(5), 266-269; 2004
Eur. Pat. Appl., 1298117, 2 Apr. 2003
Helvetica Chimica Acta, 85(7), 2195-2213; 2002
Organometallics, 20(24), 5162-5170; 2001
Journal of Organic Chemistry, 69(3), 987-990; 2004
Journal of Organic Chemistry, 62(3), 530-537; 1997

Examples 7 to 12, and Comparative Example 1 to 3

Next, by using the resulting compound for an organic EL device according to an aspect of the invention, the light-emitting layer 104 of the organic EL device 100 as shown in FIG. 10, was formed in the following manner.

That is, as the materials for forming the light-emitting layer 104, the materials shown in Table 2 were used.

TABLE 2

| | Host material | Light-emitting material | Color (CIE 1931) | Luminance (cd/m²) (100 mA/cm²) | Required voltage (V) (100 mA/cm²) | Luminance half life time (hr) (100 mA/cm²) |
|---|---|---|---|---|---|---|
| Example 7 | Host 1 | EL material 3 | (0.45, 0.54) | 8100 | 6.1 | 85 |
| Example 8 | Host 1 | EL material 4 | (0.45, 0.51) | 8200 | 6.1 | 90 |

TABLE 2-continued

|  | Host material | Light-emitting material | Color (CIE 1931) | Luminance (cd/m$^2$) (100 mA/cm$^2$) | Required voltage (V) (100 mA/cm$^2$) | Luminance half life time (hr) (100 mA/cm$^2$) |
|---|---|---|---|---|---|---|
| Example 9 | Host 2 | EL material 3 | (0.45, 0.54) | 8300 | 5.9 | 100 |
| Example 10 | Host 2 | EL material 4 | (0.45, 0.51) | 8500 | 5.9 | 105 |
| Example 11 | Host 3 | EL material 3 | (0.45, 0.54) | 8700 | 5.8 | 105 |
| Example 12 | Host 3 | EL material 4 | (0.45, 0.51) | 8800 | 5.8 | 125 |
| Comparative Example 1 | Host 1 | None | (0.17, 0.14) | 500 | 6.0 | 20 |
| Comparative Example 2 | Host 2 | None | (0.16, 0.04) | 650 | 5.8 | 35 |
| Comparative Example 3 | Host 3 | None | (0.15, 0.09) | 900 | 5.7 | 45 |

Here, in Example 7, the (ELI material 3) represented by Formula (18), and the (host 1) represented by Formula (15) were used at a mixing ratio of 1:8.7 (weight ratio), and dissolved in chloroform to obtain a solution (ink) having a solid content of 1.5 wt %. Further by using the solution (ink), the light-emitting layer 104 was formed by a spin coating method as described above. As a result, an organic EL device as a product according to Example was obtained.

In Example 8, the (EL material 4) represented by Formula (19), and the (host 1) represented by Formula (15) were used at a mixing ratio of 1:7.6 (weight ratio), and dissolved in chloroform to obtain a solution (ink) having a solid content of 1.5 wt %. Further, by using the solution (ink) the light-emitting layer 104 was formed as described above. As a result, an organic EL device as a product according to Example was obtained.

In Example 9, the (EL material 3) represented by Formula (19), and the (host 2) represented by Formula (16) were used at a mixing ratio of 1:8.7 (weight ratio) and dissolved in chloroform to obtain a solution (ink) having a solid content of 1.5 wt %. Further, by using the solution (ink), the light-emitting layer 104 was formed as described above. As a result, an organic EL device as a product according to Example was obtained.

In Example 10, the (EL material 4) represented by Formula (19), and the (host 2) represented by Formula (16) were used at a mixing ratio of 1:7.6 (weight ratio), and dissolved in chloroform to obtain a solution (ink) having a solid content of 1.5 wt %. Further, by using the solution (ink), the light-emitting layer 104 was formed as described above. As a result, an organic EL device as a product according to Example was obtained.

In Example 11, the (EL material 3) represented by Formula (18), and the (host 3) represented by Formula (17) were used at a mixing ratio of 1:8.7 (weight ratio), and dissolved in chloroform to obtain a solution (ink) having a solid content of 1.5 wt %. Further by using the solution (ink), the light-emitting layer 104 was formed as described above. As a result, an organic EL device as a product according to Example was obtained.

In Example 12, the (EL material 4) represented by Formula (19), and the (host 3) represented by Formula (17) were used at a mixing ratio of 1:7.6 (weight ratio), and dissolved in chloroform to obtain a solution (ink) having a solid content of 1.5 wt %. Further, by using the solution (ink), the light-emitting layer 104 was formed as described above. As a result, an organic EL device as a product according to Example was obtained.

Furthermore, in Comparative Example 1, the (host represented by Formula (15) was only used, and dissolved in chloroform to obtain a solution (ink) having a solid content of 1.5 wt %. Further, by using the solution (ink), the light-emitting layer 104 was formed as described above. As a result, an organic EL device as a product according to Comparative Example was obtained.

In Comparative Example 2, the (host 2) represented by Formula (16) was only used, and dissolved in chloroform to obtain a solution (ink) having a solid content of 1.5 wt %. Further, by using the solution (ink), the light-emitting layer 104 was formed as described above. As a result, an organic EL device as a product according to Comparative Example was obtained.

Furthermore, in Comparative Example 3, the (host 3) represented by Formula (17) was only used, and dissolved in chloroform to obtain a solution (ink) having a solid content of 1.5 wt %. Further, by using the solution (ink), the light-emitting layer 104 was formed as described above. As a result, an organic EL device as a product according to Comparative Example was obtained.

Evaluation of Device

For each of the above-described organic EL devices, a voltage was applied to the light-emitting layer 104 so as to make a direct current of 100 mA/cm$^2$ flow, thereby causing light to be emitted.

Figure 23:
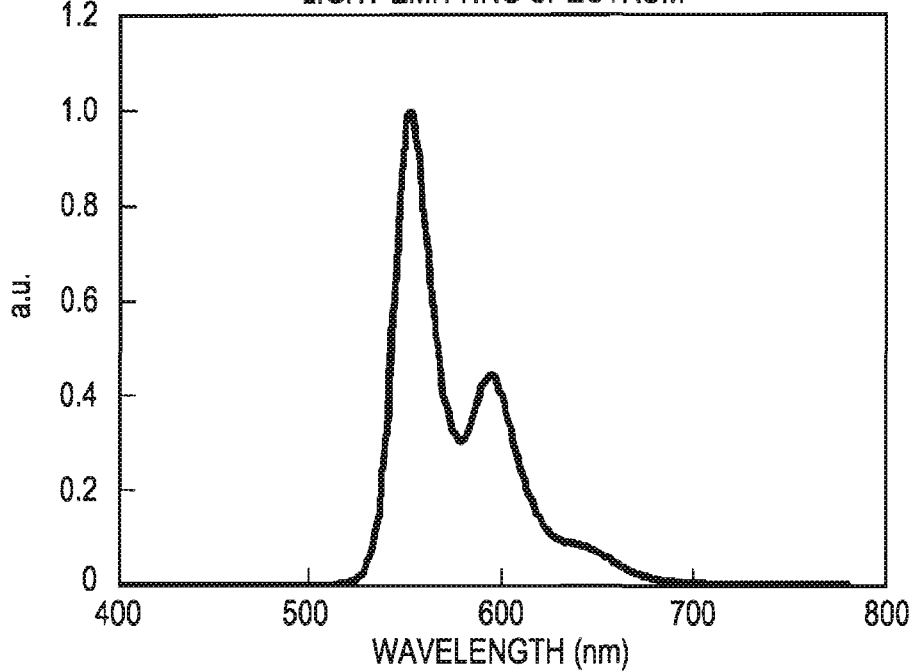
FIG. 23 is a graph illustrating the EL waveforms obtained from the light emission by an organic EL device.
Figure 24:
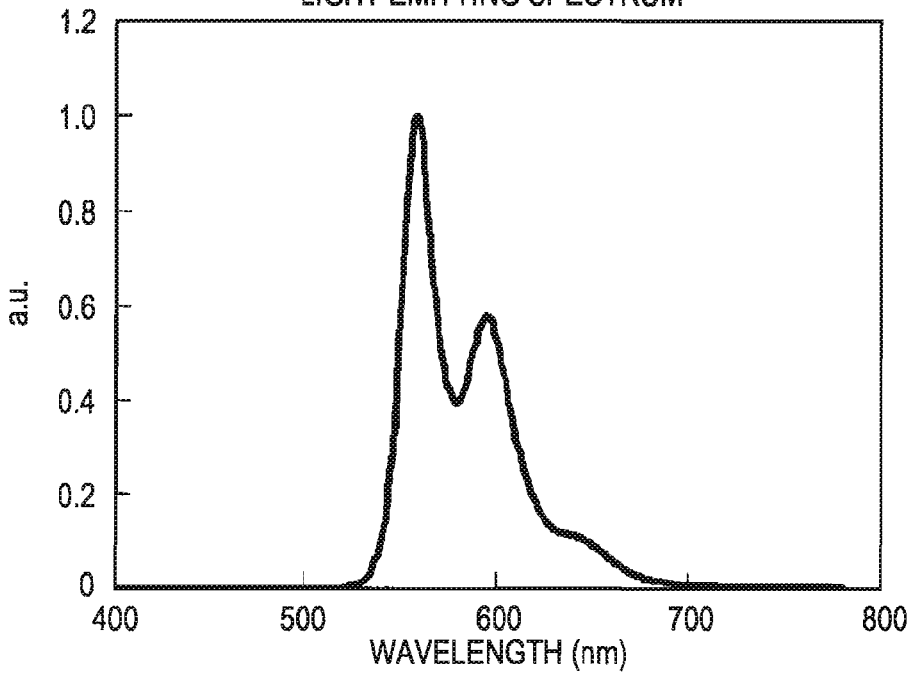
FIG. 24 is a graph illustrating the EL waveforms obtained from the light emission by an organic EL device.

The EL waveforms are shown in FIGS. 23 and 24. In FIG. 23, the EL waveforms in Examples 7, 9, and 11 are shown, and in FIG. 24, the EL waveforms in Examples 8, 10, and 12 are shown. Furthermore, for Comparative Examples, in FIG. 13, the EL waveform in Comparative Example 1 is shown, in FIG. 14, the EL waveform in Comparative Example 2 is shown, and in FIG. 15, the EL waveform in Comparative Example 3 is shown.

Furthermore, the color, the luminance, and the luminance half life (time taken for the initial luminance to be reduced to a half thereof) of the obtained emitted light, were measured, and the results are shown in Table 2.

Further, in Example 7, the applied voltage for obtaining the above-described current was 6.1 V.

Similarly, in Example 8, the applied voltage was 6.1 V, in Example 9, the applied voltage was 5.9 V, in Example 10, the applied voltage was 5.9 V, in Example 11, the applied voltage was 5.8 V, and in Example 12, the applied voltage was 5.8 V. Furthermore, as described above, in Comparative Example 1, the applied voltage was 6.0 V, in Comparative Example 2, the applied voltage was 5.8 V, and in Comparative Example 3, the applied voltage was 5.7 V.

In the above-described results, the organic EL device including the light-emitting layer 104 formed by using the compound for an organic EL device of Third Embodiment or Fourth Embodiment of the invention has excellent luminance, or luminance half life, as compared with the products of the Comparative Examples, and thus it was found that it has excellent light-emitting characteristics (luminance) and reliability (luminance half life).

Fifth Embodiment

Compound for Organic EL

In Fifth Embodiment of the compound for an organic EL device according to an aspect of the invention, the polymer molecule represented by Formula (20) was prepared by a synthesis method on the basis of the following Synthetic Example.

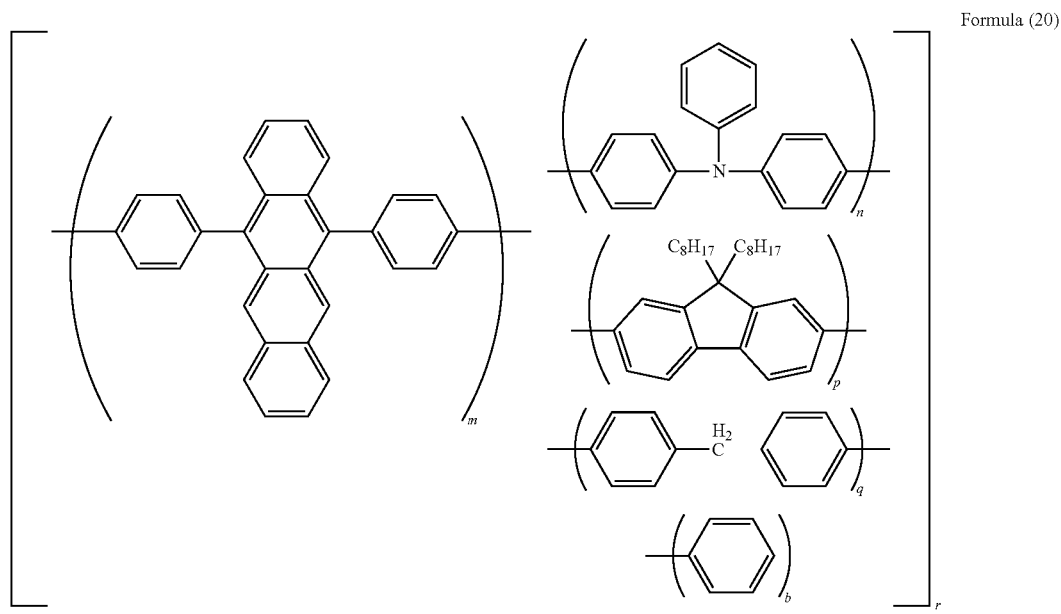

Formula (20)

(wherein the theoretical values for the synthesis reaction are as follows: m=1, n=2, p=4, q=0, b=2, and r=1, and molecular weight MW=2574)

Synthetic Example 16

Synthesis of Alcohol Intermediate

Figure 25:
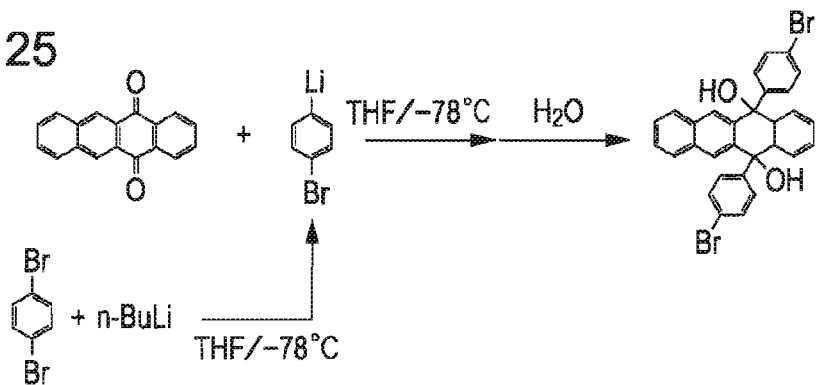
FIG. 25 is a view illustrating the synthesis method of Synthetic Example 16.

A 5,12-bis-4bromophenyl-tetracene derivative was synthesized in the following manner by a synthesis method as shown in FIG. 25.

First, 2 g ($7.7 \times 10^{-3}$ mol) of 5,12-tetracenequinone, and 100 cm$^3$ of tetrahydrofurane which had been dried as a solvent were introduced into a 500 cm$^3$ Schrenk tube that had been purged with Ar, and cooled to −78° C. (with dry ice). Separately, 4.6 g ($1.9 \times 10^{-2}$ mol) of 1,4-dibromobenzene was metered into a 300 cm$^3$ Schrenk tube. 100 cm$^3$ of tetrahydrofurane which had been dried as a solvent were introduced thereto, and cooled to −72° C. (with dry ice).

After cooling, 11.3 cm$^3$ of a 1.5 mol/l a solution of n-butyllithium in hexane was added to the solution, and left to stand for 1 hour. After leaving it to stand, a Li solution was added to a tetracenequinone solution using a spoid, while taking care not to contact the solution with atmosphere. The solution was cooled with dry ice to perform a reaction for 3 hours, and three hours later, left to stand at room temperature to perform a reaction overnight. After reaction toluene and distilled water were added thereto, and the solution was sufficiently washed using a separating lot, and thereafter, the organic layer was dried over 5 g of magnesium sulfate, and the solvent was removed using an evaporator.

Purification was carried out by silica gel chromatography and reprecipitation. As the developing solvent for silica gel chromatography, toluene was used. Further; reprecipitation was carried out using dichloromethane and hexane.

As a result, 3.5 g (yield 84%) of a white solid was obtained.

Synthetic Example 17

Figure 26:
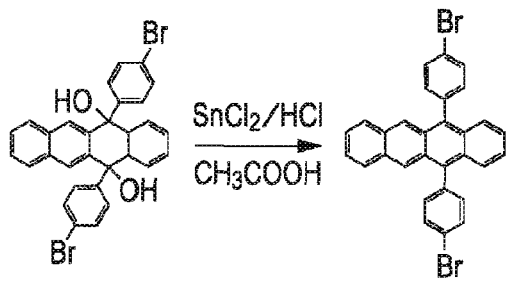
FIG. 26 is a view illustrating the synthesis method of Synthetic Example 17.

5,12-Bis-p-bromophenylnaphthacene was synthesized in the following manner by a synthesis method as shown in FIG. 26.

First, 3.0 g ($5.22 \times 10^{-3}$ mol) of the alcohol intermediate which had been previously synthesized was metered into a 300 cm$^3$-amber flask under an atmosphere. 150 cm$^3$ of acetic acid was metered thereinto as a solvent. Separately, a solution (35%) of tin chloride (II) in hydrochloric acid (tin chloride:hydrochloric acid=1:1 (weight ratio)) was prepared, and then 20 cm$^3$ of the solution was introduced into a solution of the previously obtained alcohol intermediate in acetic acid. After performing a reaction at room temperature for 3 hours, toluene was added to the solution, and sufficiently washed with distilled water using a separating lot. After sufficiently washing the solution, the organic layer was dried over 5 g of magnesium sulfate, and the solvent was removed using an evaporator.

Purification was carried out by silica gel chromatography and reprecipitation. As a developing solvent for silica gel chromatography, a mixed solution of toluene and hexane (toluene:hexane=1:2) was used. Further, reprecipitation was carried out using dichloromethane and hexane.

As a result, 2.3 g (yield 82%) of a white solid was obtained.

Synthetic Example 18

Figure 27:
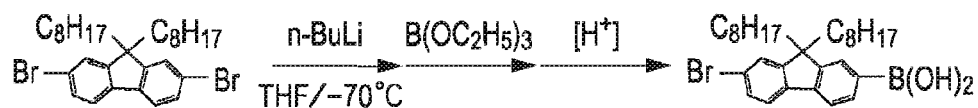
FIG. 27 is a view illustrating the synthesis method of Synthetic Example 18.

2-Bromo-9,9-di-n-octylfluorenyl-7-boric acid was synthesized in the following manner by a synthesis method as shown in FIG. 27.

First, 4 g ($7.3 \times 10^{-3}$ mol) of 2,7-dibromo-9,9-di-n-octylfluorene, and 100 cm$^3$ of THF that had been dried over sodium were added to a 200 cm$^3$ Schrenk tube that had been purged with Ar, thereby obtaining a solution. This solution was cooled to −70° C. 4.9 cm$^3$ of a 1.5 mol/l solution of n-butyllithium in hexane was added to the solution, and left to stand for 1 hour. While cooling was continued, 1.1 g ($7.5 \times 10^{-3}$ mol) of triethyl borate was added to the solution to perform a reaction for 1.5 hours. After reaction, 5 cm$^3$ of an aqueous 40% HCl solution was added to the reaction solution at 5° C. One hour later, the reaction solution was neutralized by setting pH to 7 with a saturated, aqueous sodium carbonate solution.

Then, the organic layer (THF layer) was separated using a separating lot. A suitable amount of magnesium sulfate was added to the separated THF solution to remove water. After removing magnesium sulfate using a filter paper, hexane was added to the solution to precipitate a target product.

Purification was carried out by a reprecipitation method. THF and hexane were used as the solvents.

Synthetic Example 19

Figure 28:
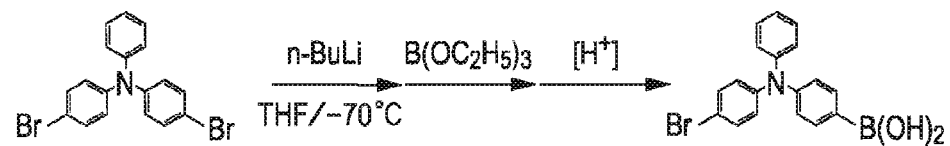
FIG. 28 is a view illustrating the synthesis method of Synthetic Example 19.
Figure 29:
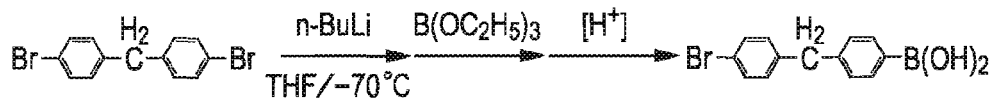
FIG. 29 is a view illustrating the synthesis method of Synthetic Example 20.

4-Bromo-triphenylaminoboric acid was synthesized in the following manner by a synthesis method as shown in FIG. 28.

First, 4 g ($9.9 \times 10^{-3}$ mol) of a commercially available 4,4'-dibromo-triphenylamine, and 100 cm$^3$ of THF that had been dried over sodium were added to a 200 cm$^3$ Schrenk tube that had been purged with Ar, thereby obtaining a solution. This solution was cooled to −70° C. 9.9 cm$^3$ ($1.48 \times 10^{-2}$ mol) of a 1.5 mol/l solution of n-butyllithium in hexane was added to the solution, and left to stand for 1 hour. While cooling was continued, 1.9 g ($1.3 \times 10^{-2}$ mol) of triethyl borate was added to the solution to perform a reaction for 1.5 hours. After reaction, 5 cm$^3$ of an aqueous 40% HCl solution was added to the reaction solution at 5° C. One hour later, the reaction solution was neutralized by setting pH to 7 with a saturated, aqueous sodium carbonate solution.

Then, the organic layer (THF layer) was separated using a separating lot. A suitable amount of magnesium sulfate was added to the separated THF solution to remove water. After removing magnesium sulfate using a filter paper, hexane was added to the solution to precipitate a target product. Purification was carried out by a reprecipitation method. THF and hexane were used as the solvents.

As a result, 1.4 g (yield 40%) of a white (pale green) solid was obtained.

Synthetic Example 20

1-(4-Bromobenzyl)-4-phenylboric acid was synthesized in the following manner by a synthesis method as shown in FIG. 5.

First, 5 g ($1.5 \times 10^{-2}$ mol) of 4,4'-bisbromophenylmethane, and 50 cm$^3$ of THF that had been dried over sodium were added to a 200 cm$^3$ Schrenk tube that had been purged with Ar, thereby obtaining a solution. This solution was cooled to −70° C. 10.2 cm$^3$ ($1.5 \times 10^{-2}$ mol) of a 1.5 mol/l solution of n-butyllithium in hexane was added to the solution, and left to stand for 1 hour. While cooling was continued, 2.2 g ($1.5 \times 10^{-2}$ mol) of triethyl borate was added to the solution to perform a reaction for 1.5 hours. After reaction, 5 cm$^3$ of an aqueous 40% HCl solution was added to the reaction solution at 5° C. One hour later, the reaction solution was neutralized by setting pH to 7 with a saturated, aqueous sodium carbonate solution.

Then, the organic layer (THF layer) was separated using a separating lot. A suitable amount of magnesium sulfate was added to the separated THF solution to remove water. Magnesium sulfate was removed using a filter paper, and then the solvent was removed using an evaporator.

As a result, 4 g of a transparent thick product was obtained, which would be used for a subsequent reaction.

Synthetic Example 21

Figure 30:
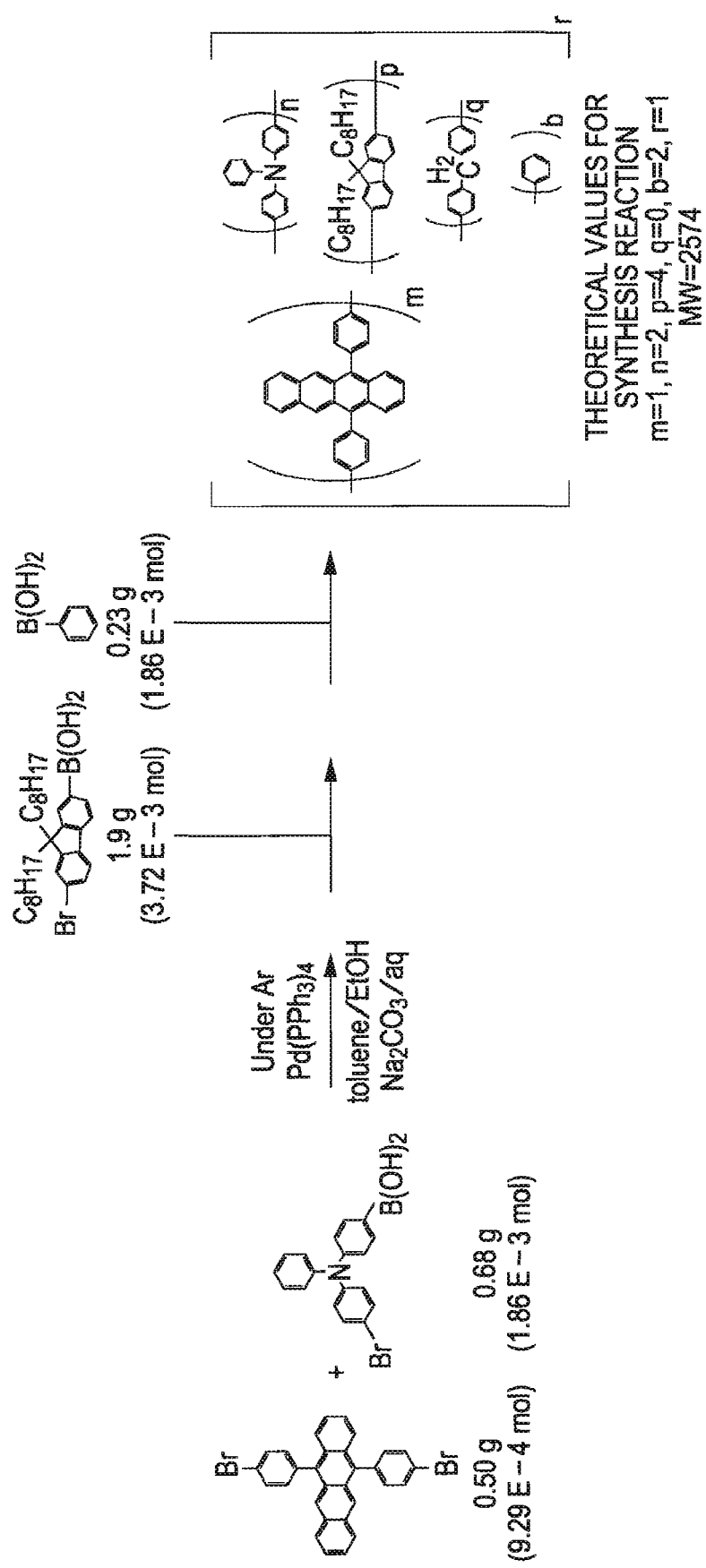
FIG. 30 is a view illustrating the synthesis method of Synthetic Example 21.

An EL material represented by Formula (20) (EL material 5), that is, the compound for an organic EL device according to Fifth Embodiment of the invention was synthesized by the synthesis route as shown in FIG. 30.

First, 0.5 g ($9.29 \times 10^{-4}$ mol) of the tetracene derivative which had been previously synthesized (in Synthetic Example 1), and 0.68 g ($1.86 \times 10^{-3}$ mol) of 4-bromo-triphenylaminoboric acid were added to a 200 cm$^3$ Schrenk tube that had been purged with Ar. Then, 50 cm$^3$ of distilled ethanol, and 100 cm$^3$ of distilled toluene were added to the mixture, thereby obtaining a solution.

Then, 0.1 g of a tetrakistriphenylphosphine palladium complex (Pd(PPh$_3$)$_4$), and 30 cm$^3$ of a saturated, aqueous sodium carbonate solution were added thereto to perform a reaction at 80° C. One hour later, 1.9 g ($3.72 \times 10^{-3}$ mol) of 2-bromo-9,9-di-n-octylfluorenyl-7-boric acid, and 0.1 g of a tetrakistriphenylphosphine palladium complex (Pd(PPh$_3$)$_4$) were added thereto to perform a reaction for 5 hours.

Thereafter, 0.23 g ($1.86 \times 10^{-3}$ mol) of a commercially available phenylboric acid was added to the solution to perform a reaction for an additional 5 hours. After reaction, air was blown into the reaction solution via bubbling while heating the solution for 30 minutes. Then, the reaction solution was cooled to room temperature, and then transferred to a 1 liter separating lot, and sufficiently washed with distilled water while being extracted with toluene. The toluene layer in the separating lot was sufficiently dried over magnesium sulfate, and then purified by silica gel chromatography and reprecipitation.

The solvents used for reprecipitation were a system using dichloromethane/hexane and a system using dichloromethane/methanol.

As a result, 0.52 g (yield 22%) of a yellow solid was obtained (as calculated in terms of the molecular weight of 2574).

Sixth Embodiment

In Sixth Embodiment of the compound for an organic EL device according to an aspect of the invention, the polymer molecule represented by Formula (21) was prepared by a synthesis method on the basis of the following Synthetic Example.

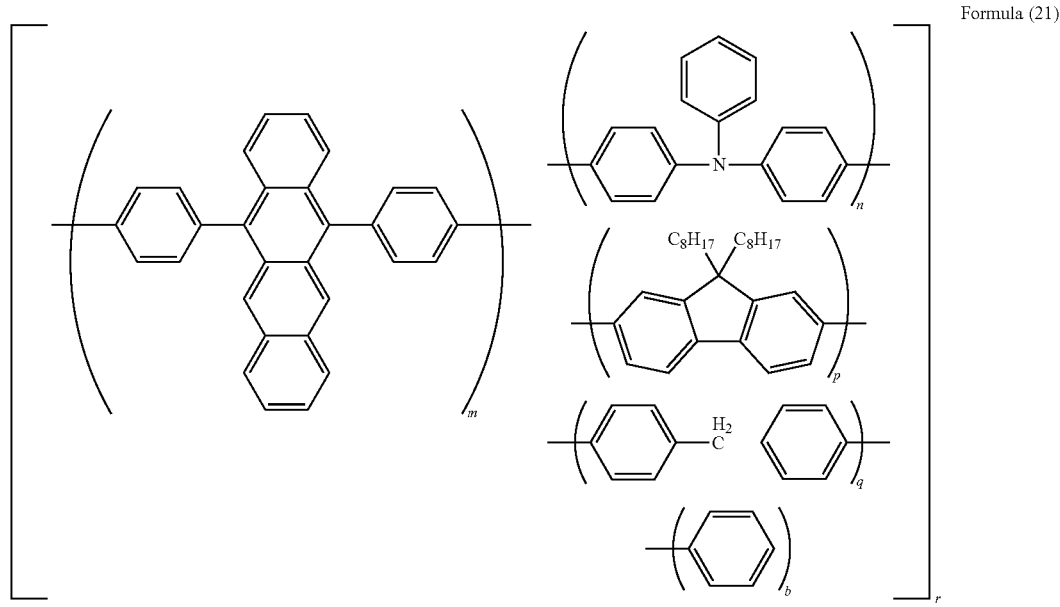

Formula (21)

(wherein the theoretical values for the synthesis reaction are as follows: m=1, n=2, p=4, q=2, b=2, and r=1, and molecular weight MW=2906)

Synthetic Example 22

Figure 31:
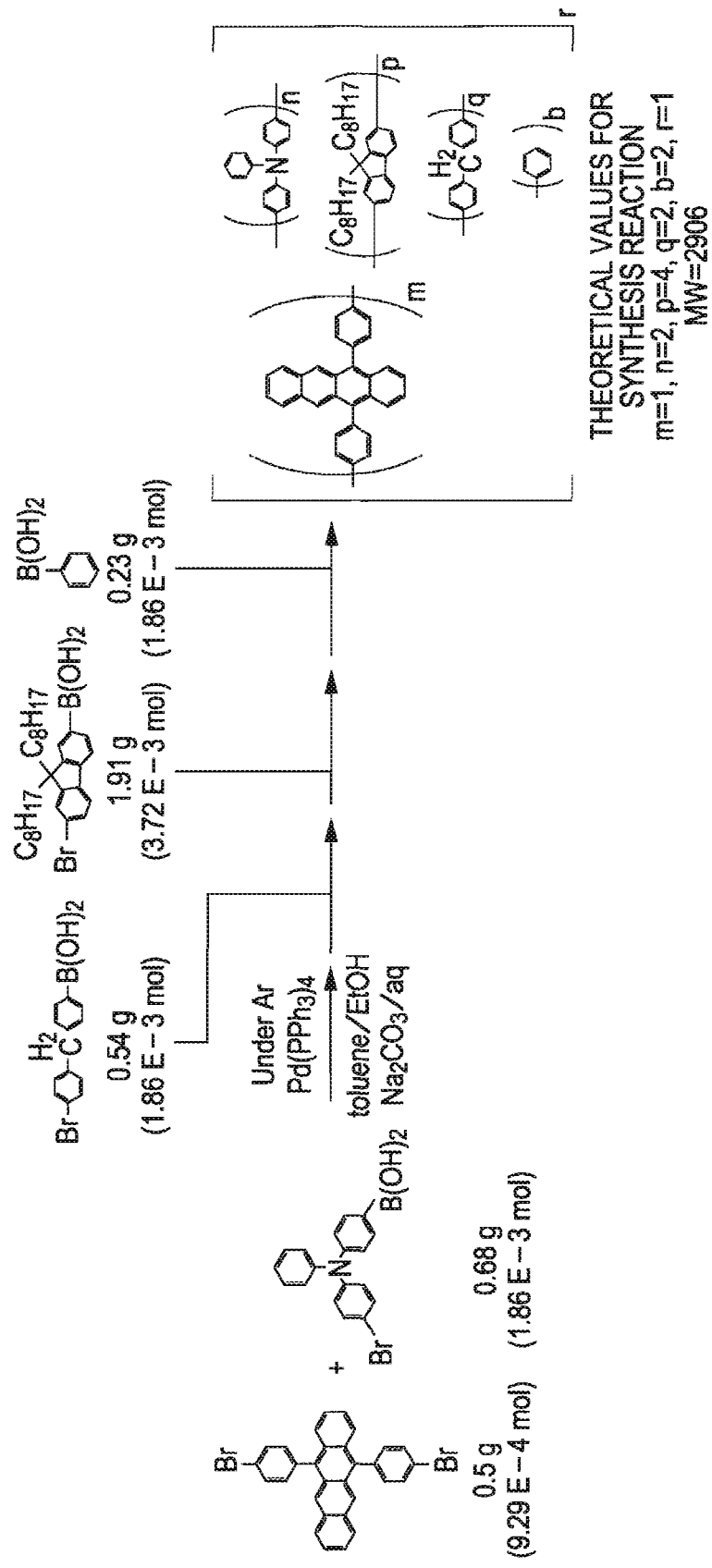
FIG. 31 is a view illustrating the synthesis method of Synthetic Example 22.

An EL material represented by Formula (21) (EL material 6) was synthesized by the synthesis route as shown in FIG. 31.

First, 0.5 g ($9.29 \times 10^{-4}$ mol) of tetracene derivative which had been previously synthesized (in Synthetic Example 1), and 0.68 g ($1.86 \times 10^{-3}$ mol) of 4-bromo-triphenylaminoboric acid were added to a 200 cm$^3$ Schrenk tube that had been purged with Ar. Then, 50 cm$^3$ of distilled ethanol, and 100 cm$^3$ of distilled toluene were added to the mixture, thereby obtaining a solutions.

Then, 0.1 g of a tetrakistriphenylphosphine palladium complex (Pd(PPh$_3$)$_4$), and 30 cm$^3$ of a saturated, aqueous sodium carbonate solution were added thereto to perform a reaction at 80° C. One hour later, 0.54 g ($1.86 \times 10^{-3}$ mol) of 1-(4-bromobenzyl)-4-phenylboric acid, and 0.07 g of a tetrakistriphenylphosphine palladium complex (Pd(PPh$_3$)$_4$) were added thereto to perform a reaction. Two hours later, 1.91 g ($3.72 \times 10^{-3}$ mol) of 2-bromo-9,9-di-n-octylfluorenyl-7-boric acid, and 0.1 g of a tetrakistriphenylphosphine palladium complex (Pd(PPh$_3$)$_4$) were added thereto to perform a reaction for 5 hours.

Thereafter, 0.23 g ($1.86 \times 10^{-3}$ mol) of a commercially available phenylboric acid was added to the solution to perform a reaction for an additional 5 hours. After reaction, air was blown into the reaction solution via bubbling while heating the solution for 30 minutes. Then, the reaction solution was cooled to room temperature, and then transferred to a 1 liter separating lot, and sufficiently washed with distilled water while being extracted with toluene. The toluene layer in the separating lot was sufficiently dried over magnesium sulfate, and then purified by silica gel chromatography and reprecipitation.

The solvents used for reprecipitation were a system using dichloromethane/hexane and a system using dichloromethane/methanol.

As a result, 0.54 g (yield 20%) of a yellow solid was obtained (as calculated in terms of the molecular weight of 2906).

For details of the synthesis processes described above, see the following references.

REFERENCE MATERIALS FOR SYNTHESIS

Polymers for Advanced Technologies, 15(5), 266-269; 2004
Eur. Pat. Appl., 1298117, 2 Apr. 2003
Helvetica Chimica Acta, 85(7), 2195-2213; 2002
Organometallics, 20(24), 5162-5170; 2001
Journal of Organic Chemistry, 69(3), 987-990; 2004
Journal of Organic Chemistry, 62(3), 530-537; 1997
Journal of the American Chemical Society (1963), 85(11), 1561-4.

Examples 13 to 18, and Comparative Examples 1 to 3

Next, by using the resulting compound for an organic EL device according to an aspect of the invention, the light-emitting layer 104 of the organic EL device 100 as shown in FIG. 10, was formed in the following manner.

That is, as the materials for forming the light-emitting layer 104, the materials shown in Table 3 were used.

TABLE 3

|  | Host material | Light emitting material | Color (CIE 1931) | Luminance (cd/m$^2$) (100 mA/cm$^2$) | Required voltage (V) (100 mA/cm$^2$) | Luminance half life time (hr) (100 mA/cm$^2$) |
|---|---|---|---|---|---|---|
| Example 13 | Host 1 | EL material 5 | (0.25, 0.67) | 7000 | 6.3 | 60 |
| Example 14 | Host 1 | EL material 6 | (0.31, 0.65) | 8100 | 6.3 | 75 |
| Example 15 | Host 2 | EL material 5 | (0.25, 0.67) | 7200 | 6.1 | 80 |
| Example 16 | Host 2 | EL material 6 | (0.31, 0.65) | 8400 | 6.1 | 100 |
| Example 17 | Host 3 | EL material 5 | (0.25, 0.67) | 7500 | 5.8 | 110 |
| Example 18 | Host 3 | EL material 6 | (0.31, 0.65) | 9000 | 5.8 | 120 |
| Comparative Example 1 | Host 1 | None | (0.17, 0.14) | 500 | 6.0 | 20 |
| Comparative Example 2 | Host 2 | None | (0.16, 0.04) | 650 | 5.8 | 35 |
| Comparative Example 3 | Host 3 | None | (0.15, 0.09) | 900 | 5.7 | 45 |

Here, in Example 13 the (EL material 5) represented by Formula (20), and the (host 1) represented by Formula (15) were used at a mixing ratio of 1:6.35 (weight ratio), and dissolved in chloroform to obtain a solution (ink) having a solid content of 1.5 wt %. Further, by using the solution (ink), the light-emitting layer 104 was formed by a spin coating method as described above. As a result, an organic EL device as a product according to Example was obtained.

In Example 14, the (EL material 6) represented by Formula (21), and the (host 1) represented by Formula (15) were used at a mixing ratio of 1:5.51 (weight ratio), and dissolved in chloroform to obtain a solution (ink) having a solid content of 1.5 wt %. Further, by using the solution (ink), the light-emitting layer 104 was formed as described above. As a result, an organic EL, device as a product according to Example was obtained.

In Example 15, the (EL material 5) represented by Formula (20), and the (host 2) represented by Formula (16) were used at a mixing ratio of 1:6.35 (weight ratio), and dissolved in chloroform to obtain a solution (ink) having a solid content of 1.5 wt %. Further, by using the solution (ink), the light-emitting layer 104 was formed as described above. As a result, an organic EL device as a product according to Example was obtained.

In Example 16, the (EL material 6) represented by Formula (21), and the (host 2) represented by Formula (16) were used at a mixing ratio of 1:5.51 (weight ratio), and dissolved in chloroform to obtain a solution (ink) having a solid content of 1.5 wt %. Further, by using the solution (ink), the light-emitting layer 104 was formed as described above. As a result, an organic EL device as a product according to Example was obtained.

In Example 17, the (EL material 5) represented by Formula (20), and the (host 3) represented by Formula (17) were used at a mixing ratio of 1:6.35 (weight ratio), and dissolved in chloroform to obtain a solution (ink) having a solid content of 1.5 wt %. Further, by using the solution (ink), the light-emitting layer 104 was formed as described above. As a result, an organic EL device as a product according to Example was obtained.

In Example 18, the (EL material 6) represented by Formula (21), and the (host 3) represented by Formula (17) were used at a mixing ratio of 1:5.51 (weight ratio), and dissolved in chloroform to obtain a solution (ink) having a solid content of 1.5 wt %. Further, by using the solution (ink), the light-emitting layer 104 was formed as described above. As a result, an organic EL device as a product according to Example was obtained.

Furthermore, in Comparative Example 1, the (host 1) represented by Formula (15) was only used, and dissolved in chloroform to obtain a solution (ink) having a solid content of 1.5 wt %. Further, by using the solution (ink), the light-emitting layer 104 was formed as described above. As a result, an organic EL device as a product according to Comparative Example was obtained.

In Comparative Example 2, the (host 2) represented by Formula (16) was only used, and dissolved in chloroform to obtain a solution (ink) having a solid content of 1.5 wt %. Further, by using the solution (ink), the light-emitting layer 114 was formed as described above. As a result, an organic EL device as a product according to Comparative Example was obtained.

In Comparative Example 3, the (host 3) represented by Formula (17) was only used, and dissolved in chloroform to obtain a solution (ink) having a solid content of 1.5 wt %. Further, by using the solution (ink), the light-emitting layer 104 was formed as described above. As a result, an organic EL device as a product according to Comparative Example was obtained.

Evaluation of Device

For each of the above-described organic EL devices, a voltage was applied to the light-emitting layer 104 so as to make a direct current of 100 mA/cm$^2$ flow, thereby causing light to be emitted.

Figure 32:
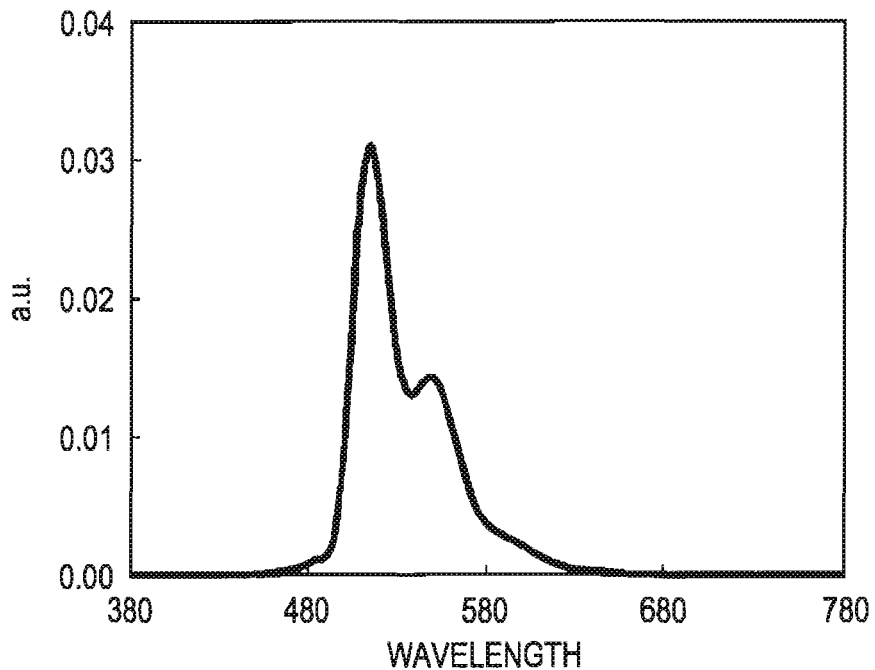
FIG. 32 is a graph illustrating the EL waveforms obtained from the light emission by an organic EL device.
Figure 33:
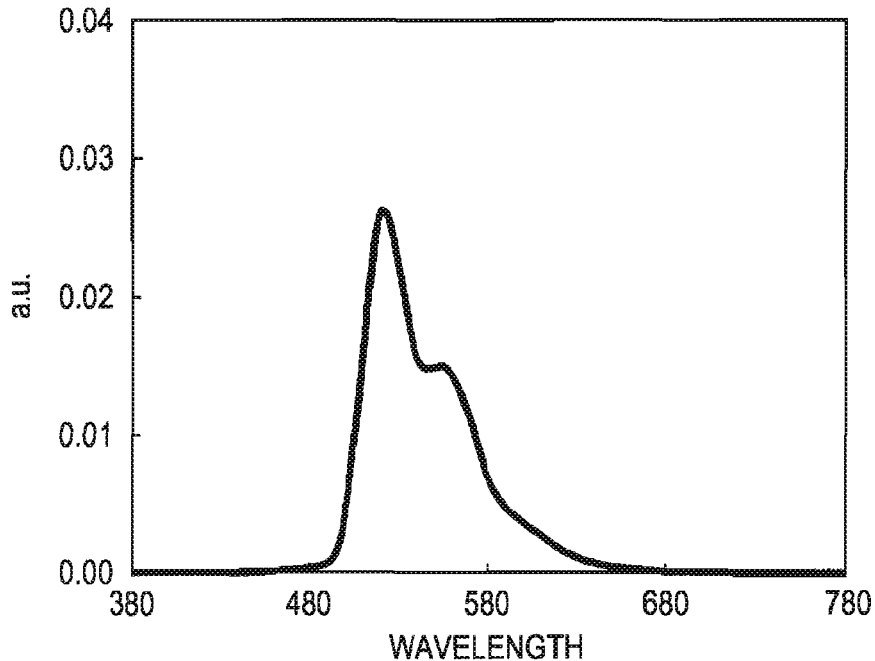
FIG. 33 is a graph illustrating the EL waveforms obtained from the light emission by an organic EL device.

The EL waveforms are shown in FIGS. 32 and 33. In FIG. 32, the EL waveforms in Examples 13, 15, and 17 are shown, and in FIG. 33, the EL waveforms In Examples 14, 16, and 18 are shown. Furthermore, for Comparative Examples, in FIG. 13, the EL waveform in Comparative Example 1 is shown, in FIG. 14, the EL waveform in Comparative Example 2 is shown, and in FIG. 15, the EL waveform in Comparative Example 3 is shown.

Furthermore, the color, the luminance, and the luminance half life (time taken for the initial luminance to be reduced to a half thereof) of the obtained emitted light, were measured, and the results are shown in Table 3.

Further, in Example 13, the applied voltage for obtaining the above-described current was 6.3 V.

Similarly, in Example 14, the applied voltage was 6.3 V, in Example 15, the applied voltage was 6.1 V, in Example 16, the applied voltage was 6.1 V, in Example 17, the applied voltage was 5.8 V, and in Example 18, the applied voltage was 5.8 V. Furthermore, as described above, in Comparative Example 1, the applied voltage was 6.0 V, in Comparative Example 2, the applied voltage was 5.8 V, and in Comparative Example 3, the applied voltage was 5.7 V.

In the above-described results, the organic EL device including the light-emitting layer 104 formed by using the compound for an organic EL device of Sixth Embodiment or Fourth Embodiment of the invention has excellent luminance, or luminance half life, as compared with the products of the Comparative Examples, and thus it was found that it has excellent light-emitting characteristics (luminance) and reliability (luminance half life).

Therefore, the organic EL device of the invention has higher luminous efficiency, and longer life time, as compared with the devices according to a conventional art.

What is claimed is:

1. A composition for an organic EL device as a light-emitting material for use in an organic EL device, comprising a polymer molecule represented by Formula (8):

Formula (8)

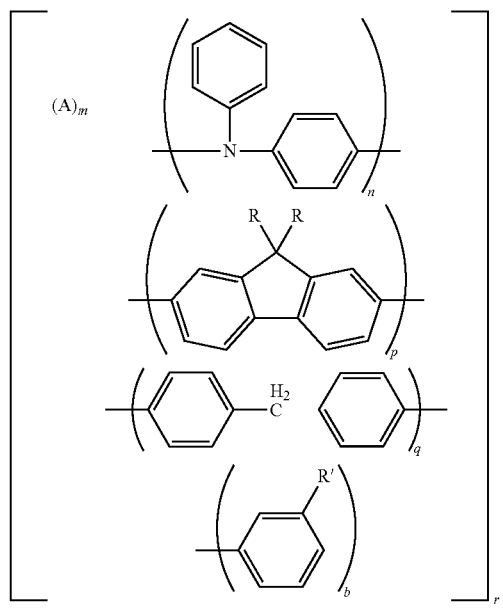

wherein A represents one selected from the groups represented by Formulas (9) to (11); R represents an alkyl group, an aryl group, or an alkylaryl group; R' represents hydrogen, an alkyl group, or an alkylaryl group; m, n, and p each represent an integer of at least 1; q and b each represent an integer of at least 0; and r represents an integer of at least 1, Formula (9)

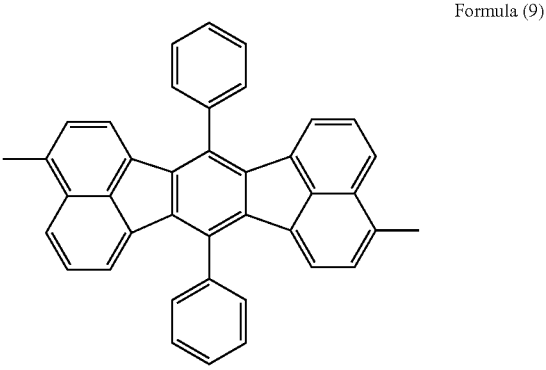

Formula (10)

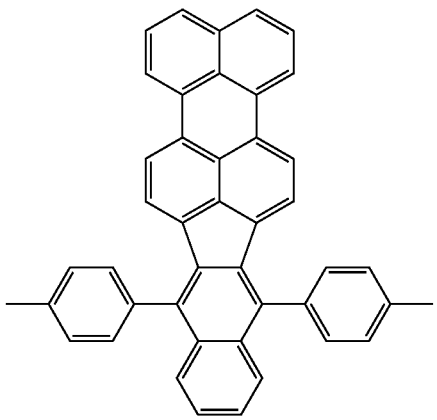

Formula (11)

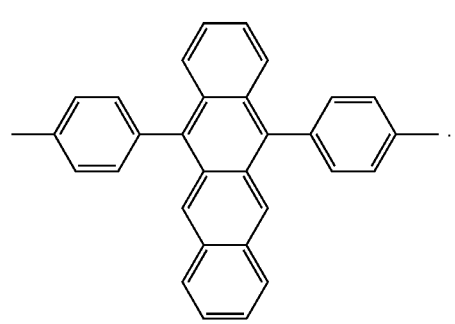

2. The composition for an organic EL device according to claim 1, wherein the integer m is 1 or 2.

3. The composition for an organic EL device according to claim 1, wherein the integer n is at least 2.

4. The composition for an organic EL device according to claim 1, wherein the integer p is 1 to 4.

5. The composition for an organic EL device according to claim 1, wherein the unit A represented by A is directly connected to the unit represented by Formula (1) at one or more points.

6. An organic EL device comprising the composition for an organic EL device according to claim 1.

7. An organic EL device comprising the composition for an organic EL device according to claim 1 in a light-emitting layer.

8. The organic EL device according to claim 7, wherein at least one layer of a hole injecting layer or a hole transporting layer is provided between the light-emitting layer and an anode.

9. The organic EL device according to claim 7, wherein the light-emitting layer is prepared by application using a spin coating method or a liquid droplet discharge method.

10. An organic EL device comprising the composition for an organic EL device according to claim 1 as a light-emitting dopant material in a light-emitting layer.

11. The organic EL device according to claim 10,
wherein the light-emitting layer is formed of the light-emitting dopant material and a host material, and
the light-emitting dopant material and the host material are contained in the light-emitting layer at such a ratio that k expressed in % by weight, as calculated by Equation (12) is 0.5% by weight or more and 10.0% by weight or less:

$$k = (a/(b+c)) \times 100$$ Equation (12)

wherein a is the weight of the units containing the light-emitting molecules in the light-emitting dopant material, b is the weight of the light-emitting dopant material used, and c is the weight of the host material used.

12. The organic EL device according to claim 10, wherein the light-emitting layer is formed of the light-emitting dopant material and the host material, and wherein the host material is a homopolymer or copolymer containing at least one material selected from fluorene, arylamine, and anthracene.

* * * * *